(12) United States Patent
Lin et al.

(10) Patent No.: US 11,751,436 B2
(45) Date of Patent: Sep. 5, 2023

(54) DISPLAY PANEL AND MANUFACTURING METHOD THEREOF

(71) Applicant: Au Optronics Corporation, Hsinchu (TW)

(72) Inventors: Yu-Syuan Lin, Hsinchu (TW); Chien-Chuan Chen, Hsinchu (TW); Peng-Yu Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 176 days.

(21) Appl. No.: 17/513,890

(22) Filed: Oct. 29, 2021

(65) Prior Publication Data
US 2023/0035136 A1    Feb. 2, 2023

(30) Foreign Application Priority Data
Jul. 28, 2021 (TW) .................................. 110127652

(51) Int. Cl.
*H10K 59/122*      (2023.01)
*H10K 59/35*      (2023.01)
*H10K 71/00*      (2023.01)
*H10K 59/12*      (2023.01)

(52) U.S. Cl.
CPC ........... *H10K 59/122* (2023.02); *H10K 59/35* (2023.02); *H10K 71/00* (2023.02); *H10K 59/1201* (2023.02)

(58) Field of Classification Search
CPC ...... H10K 59/122; H10K 59/35; H10K 71/00; H10K 59/1201
USPC .......................................................... 257/40
See application file for complete search history.

(56) References Cited

U.S. PATENT DOCUMENTS

| | | | |
|---|---|---|---|
| 11,569,312 B2 * | 1/2023 | Kim ..................... | H10K 59/122 |
| 2018/0033842 A1 * | 2/2018 | Bae ......................... | H10K 71/12 |
| 2020/0194518 A1 * | 6/2020 | Myung .................. | H10K 59/10 |
| 2023/0035136 A1 * | 2/2023 | Lin ......................... | H10K 71/00 |
| 2023/0137666 A1 * | 5/2023 | Lee ........................ | H10K 50/818 |
| | | | 257/40 |

* cited by examiner

*Primary Examiner* — Xia L Cross
(74) *Attorney, Agent, or Firm* — JCIPRNET

(57) ABSTRACT

A display panel includes a circuit substrate, a plurality of first electrodes, a first bank layer, a second bank layer, an organic light-emitting material layer, and a second electrode. The first bank layer is located on the first electrodes and has a plurality of first openings overlapped with the first electrodes. The second bank layer is located on the first bank layer and the circuit substrate. The second bank layer has a plurality of second openings extended along a first direction. A single second opening has a different width in a second direction. The second openings are overlapped with the first openings, and the second openings and the first openings together form organic light-emitting material filling regions. A maximum width of a first portion of each organic light-emitting material filling region is greater than a maximum width of a second portion of each organic light-emitting material filling region.

15 Claims, 22 Drawing Sheets

US 11,751,436 B2

DISPLAY PANEL AND MANUFACTURING METHOD THEREOF

CROSS-REFERENCE TO RELATED APPLICATION

This application claims the priority benefit of Taiwan application serial no. 110127652, filed on Jul. 28, 2021. The entirety of the above-mentioned patent application is hereby incorporated by reference herein and made a part of this specification.

BACKGROUND OF THE INVENTION

Field of the Invention

The invention relates to a display panel, and more particularly to a display panel including an organic light-emitting material and a manufacturing method thereof.

Description of Related Art

The organic light-emitting diode (OLED) is a type of electroluminescent semiconductor element that has advantages such as high efficiency, long life, resistance to damage, fast response speed, and high reliability. With the advancement of manufacturing process techniques, the size of organic light-emitting diodes is gradually reduced, thereby resulting in a display device with higher resolution. However, to manufacture a high-resolution display device, the process accuracy of depositing an organic light-emitting material needs to be sufficiently high. Otherwise, the organic light-emitting material may be formed in an unexpected region and affect the picture quality of the display device.

SUMMARY OF THE INVENTION

The invention provides a display panel that may improve the production yield of an organic light-emitting material layer.

The invention provides a manufacturing method of a display panel that may reduce the negative impact on a display screen caused by the junction between a first organic light-emitting material layer and a second organic light-emitting material layer.

At least one embodiment of the invention provides a display panel. The display panel includes a circuit substrate, a plurality of first electrodes, a first bank layer, a second bank layer, an organic light-emitting material layer, and a second electrode. The first electrodes are located on the circuit substrate and located in a display region. The first bank layer is located on the first electrodes and has a plurality of first openings overlapped with the first electrodes. The second bank layer is located on the first bank layer and on the circuit substrate, and has a plurality of second openings extended along a first direction. A single second opening has a different width in a second direction. The second openings are overlapped with the first openings, and the second openings and the first openings together form a plurality of organic light-emitting material filling regions. A maximum width of a first portion of each of the organic light-emitting material filling regions is greater than a maximum width of a second portion of each of the organic light-emitting material filling regions. The organic light-emitting material layer is filled in the organic light-emitting material filling regions. The second electrode is located on the organic light-emitting material layer. The first electrodes, the organic light-emitting material layer, and the second electrode define a plurality of sub-pixels, and the second portion of each of the organic light-emitting material filling regions spans a plurality of corresponding sub-pixels.

At least one embodiment of the invention provides a manufacturing method of a display panel, including: providing a circuit substrate; forming a plurality of first electrodes on the circuit substrate; forming a first bank layer on the circuit substrate, wherein the first bank layer has a plurality of first openings overlapped with the first electrodes; forming a second bank layer on the first bank layer and on the circuit substrate, wherein the second bank layer has a plurality of second openings extended along a first direction, a single second opening has a different width in a second direction, the second openings are overlapped with the first openings, the second openings and the first openings together form a plurality of organic light-emitting material filling regions, and a maximum width of a first portion of each of the organic light-emitting material filling regions is greater than a maximum width of a second portion of each of the organic light-emitting material filling regions. A first spray head is moved parallel to the second direction, and fills a first organic light-emitting material layer in the organic light-emitting material filling regions; a second spray head is moved parallel to the second direction, and fills a second organic light-emitting material layer in the organic light-emitting material filling regions, wherein a side of the first organic light-emitting material layer is connected to a side of the second organic light-emitting material layer, and the first portion of the organic light-emitting material filling regions is adjacent to or located at a junction of the first organic light-emitting material layer and the second organic light-emitting material layer; and a second electrode is formed on the first organic light-emitting material layer and the second organic light-emitting material layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
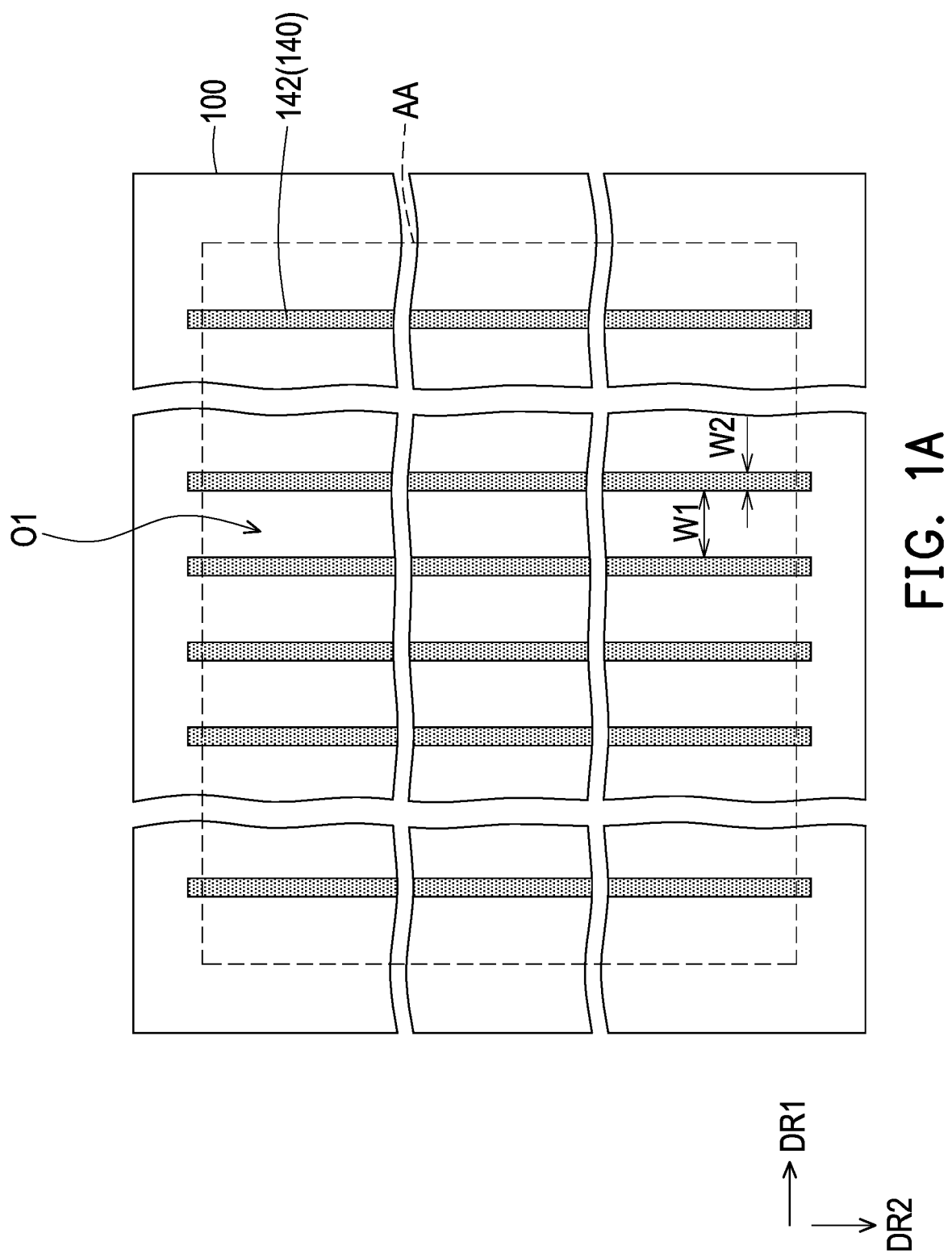
FIG. 1A is a schematic top view of a base and a first bank layer of a display panel according to an embodiment of the invention.
Figure 1B:
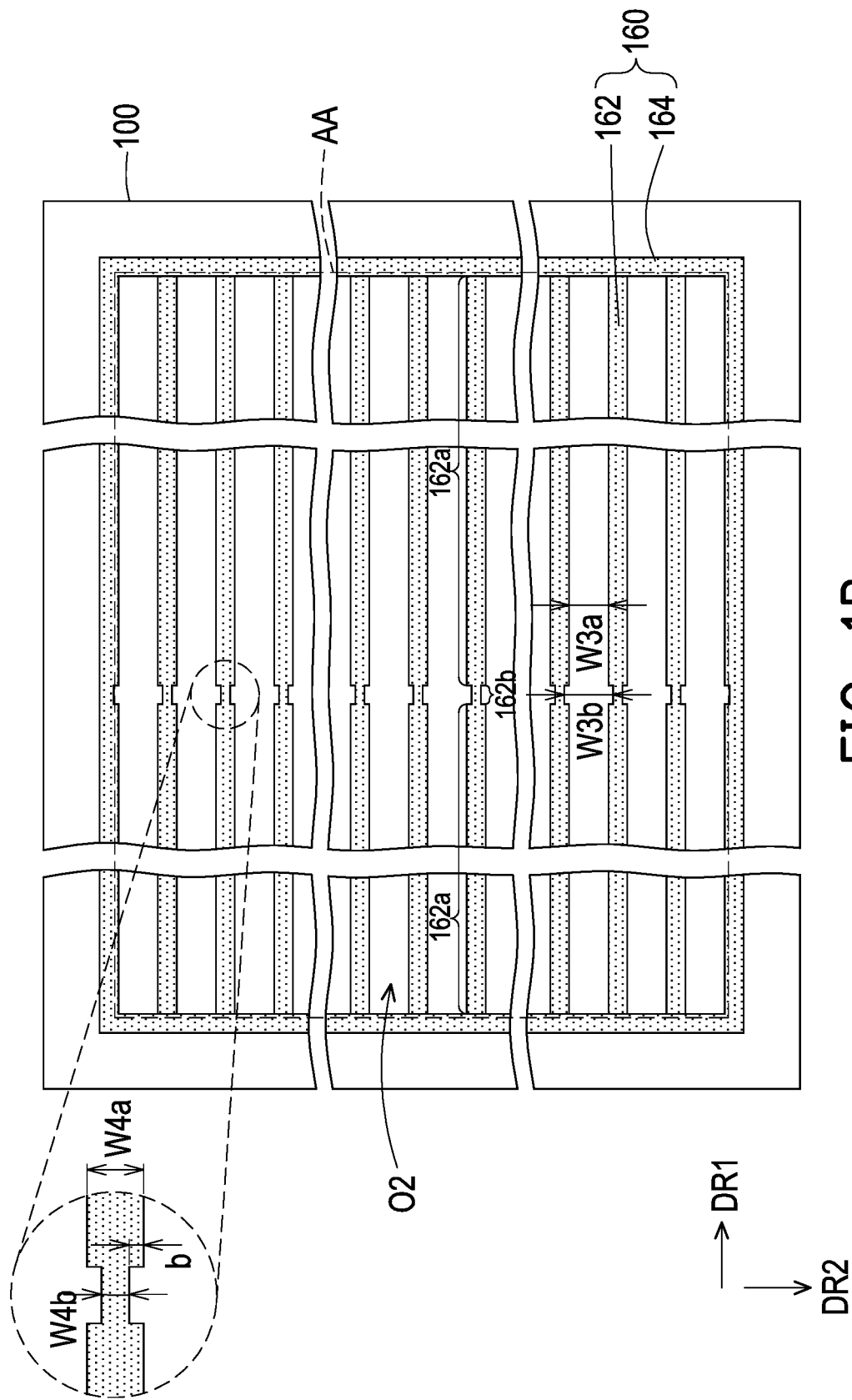
FIG. 1B is a schematic top view of a base and a second bank layer of a display panel according to an embodiment of the invention.

FIG. 1A is a schematic top view of a base and a first bank layer of a display panel according to an embodiment of the invention. FIG. 1B is a schematic top view of a base and a second bank layer of a display panel according to an embodiment of the invention. FIG. 1C and FIG. 3 to FIG. 7 are schematic top views of a manufacturing method of a display panel according to an embodiment of the invention, wherein FIG. 1C and FIG. 3 to FIG. 7 omit some components in the circuit substrate. FIG. 2A is a schematic cross-sectional view along line A-A' of FIG. 1C. FIG. 2B is a schematic cross-sectional view along line B-B' of FIG. 1C. FIG. 2C is a schematic cross-sectional view along line C-C' of FIG. 1C. FIG. 2D is a schematic cross-sectional view along line D-D' of FIG. 1C.

Referring to FIG. 1C and FIG. 2A to FIG. 2D, a circuit substrate CB is provided. In the present embodiment, the circuit substrate CB includes a base 100, an active element 120, an insulating layer 110, and a flat layer 130.

The material of the base 100 may be glass, quartz, organic polymer, or an opaque/reflective material (such as conductive material, metal, wafer, ceramic, or other suitable materials), or other suitable materials. If a conductive material or a metal is used, then an insulation layer (not shown) is covered on the base 100 to avoid a short circuit issue.

The active element 120 and the insulating layer 110 are disposed on the base 100. The active element 120 is, for example, a thin-film transistor of any form. For example, the active element 120 is a bottom-gate thin-film transistor, a top-gate thin-film transistor, a double-gate thin-film transistor, or other types of thin-film transistors. The active element 120 includes, for example, a polycrystalline silicon semiconductor, a monocrystalline silicon semiconductor, an organic semiconductor, a metal-oxide semiconductor, or other types of semiconductors. In some embodiments, the circuit substrate CB further includes other conductive wires (not shown in the figures) and passive elements (not shown in the figures), but the invention is not limited thereto.

The flat layer 130 is disposed on the active element 120 and the insulating layer 110. The flat layer 130 and the insulating layer 110 include, for example, an organic material or an inorganic material.

A plurality of first electrodes 150 are formed on the circuit substrate CB, and the first electrodes 150 are located in a display region AA. In the present embodiment, the first electrodes 150 are electrically connected to the active element 120 via a through hole 132 in the flat layer 130. For example, each of the first electrodes 150 is electrically connected to one corresponding active element 120.

Please refer to FIG. 1A, FIG. 1C, and FIG. 2A to FIG. 2D, a first bank layer 140 is formed on the circuit substrate CB. In the present embodiment, the first bank layer 140 includes a plurality of first strip structures 142. The first strip structures 142 are located in the display region AA. The first strip structures 142 are arranged along a first direction DR1, and each of the first strip structures 142 is extended along a second direction DR2. The first direction DR1 is not parallel to the second direction DR2. For example, the first direction DR1 is perpendicular to the second direction DR2.

The first bank layer 140 has a plurality of first openings O1 overlapped with the first electrodes 150. In the present embodiment, the first openings O1 are the gaps between adjacent first strip structures 142, and each of the first openings O1 is extended along the second direction DR2 and overlapped with a plurality of corresponding first electrodes 150. A width W1 of the first openings O1 depends on the resolution of the display panel. The width W1 of the first openings O1 is, for example, 50 μm to 200 μm. A width W2 of the first strip structures 142 is, for example, 5 μm to 50 μm. A thickness T1 of the first bank layer 140 is, for example, 0.2 μm to 2 μm.

In some embodiments, the first bank layer 140 includes a cured photoresist, and the method of forming the first bank layer 140 includes a lithography process, but the invention is not limited thereto. In other embodiments, the first bank layer 140 includes other organic materials. In some embodiments, the first bank layer 140 includes a hydrophilic material, but the invention is not limited thereto.

Referring to FIG. 1B, FIG. 1C, and FIG. 2A to FIG. 2D, a second bank layer 160 is formed on the first bank layer 140 and on the circuit substrate CB. In the present embodiment, the second bank layer 160 includes a plurality of second strip structures 162 and an outer frame portion 164. The second strip structures 162 are located in the display region AA. The second strip structures 162 are arranged along the second direction DR2, and each of the second strip structures 162 is extended along the first direction DR1. The second strip structures 162 are staggered with the first strip structures 142. The outer frame portion 164 is located at the edge of the display region AA, and the outer frame portion 164 surrounds the display region AA. In the present embodiment, the outer frame portion 164 is connected to two ends of the second strip structures 162.

The second bank layer 160 has a plurality of second openings O2 overlapped with the first electrodes 150. In the present embodiment, the second openings O2 are the gaps between adjacent second strip structures 162, and each of the second openings O2 is extended along the first direction DR1 and overlapped with a plurality of corresponding first electrodes 150.

A single second opening O2 has different widths W3a and W3b in the second direction DR2. Specifically, in the present embodiment, each of the second strip structures 162 has a plurality of thick portions 162a and at least one narrow portion 162b located between the thick portions 162a. A width W4a of the thick portions 162a is greater than a width W4b of the narrow portion 162b, so that the second openings O2 have the different widths W3a and W3b. In some embodiments, two opposite sides of each of the second strip structures 162 are both provided with grooves corresponding to the narrow portion 162b, and the grooves are aligned with each other in the second direction DR2, but the invention is not limited thereto. In some embodiments, the width W4b of the narrow portion 162b is greater than 10 For example, the width W4b of the narrow portion 162b is equal to the width W4a of the thick portions 162a minus twice a reduced width b of the second strip structures 162 on a single side (that is, the depth of the grooves on a single side), and W4a-2b>10 In some embodiments, the reduced width b is 0.5 μm to 40 μm.

With the design of the narrow portion 162b, the width W3b of the second openings O2 at the positions corresponding to the narrow portion 162b is greater than the width W3a of the second openings O2 at the positions corresponding to the thick portions 162a. For example, the width W3a is 10 μm to 50 μm, and the width W3b is 10.5 μm to 90 μm.

Figure 1C:
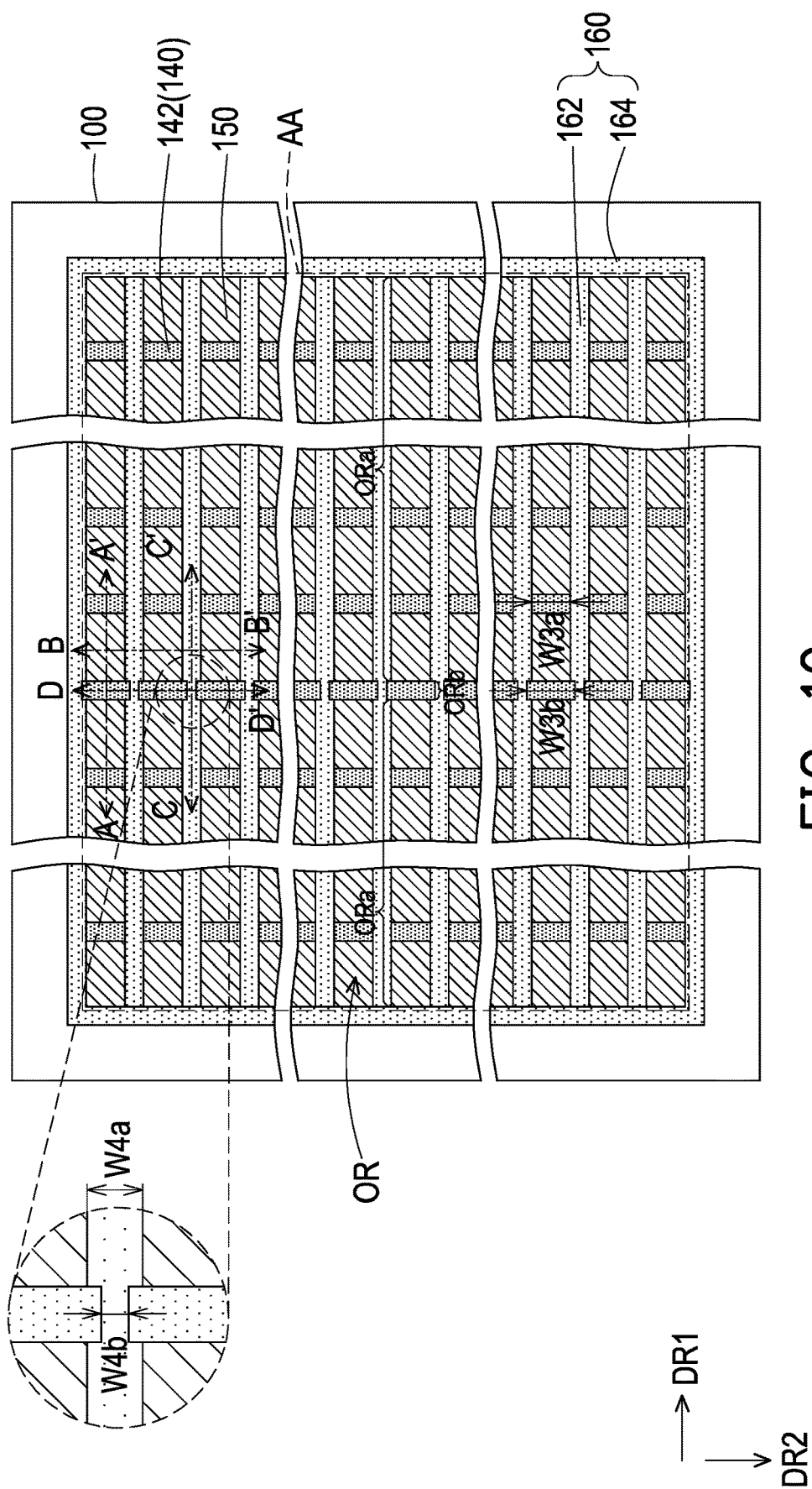
FIG. 1C and FIG. 3 to FIG. 7 are top views of a manufacturing method of a display panel according to an embodiment of the invention.
Figure 2A:
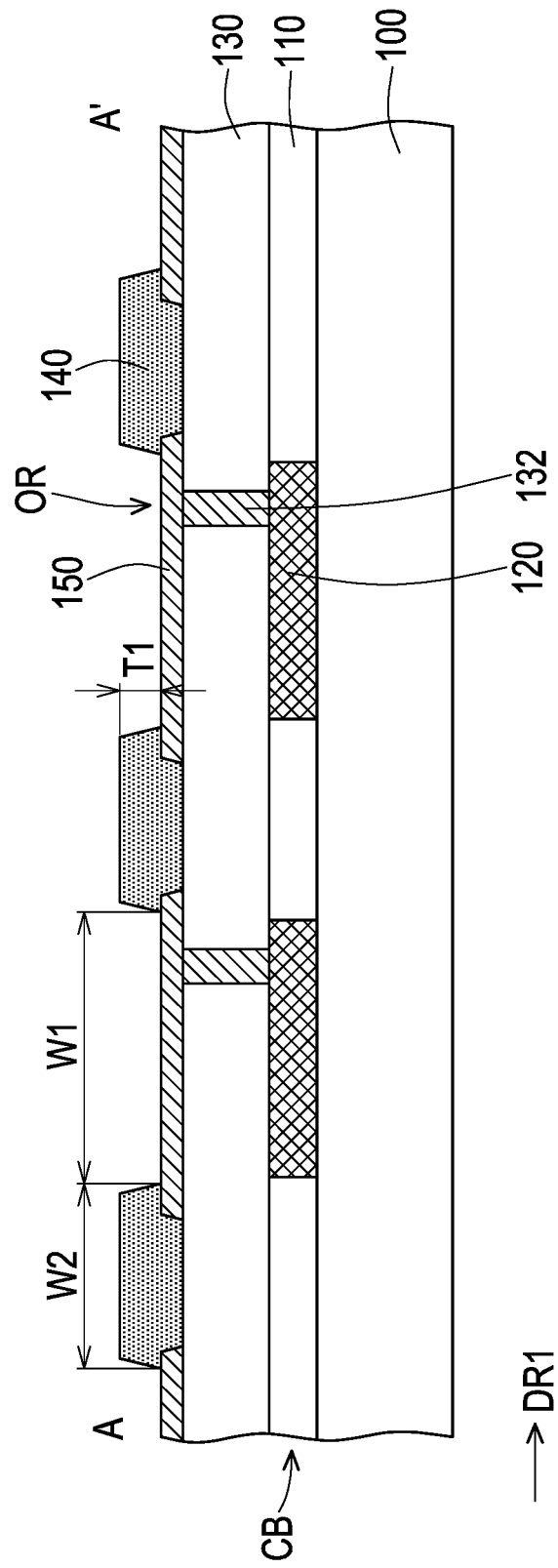
FIG. 2A is a schematic cross-sectional view along line A-A' of FIG. 1C.
Figure 2B:
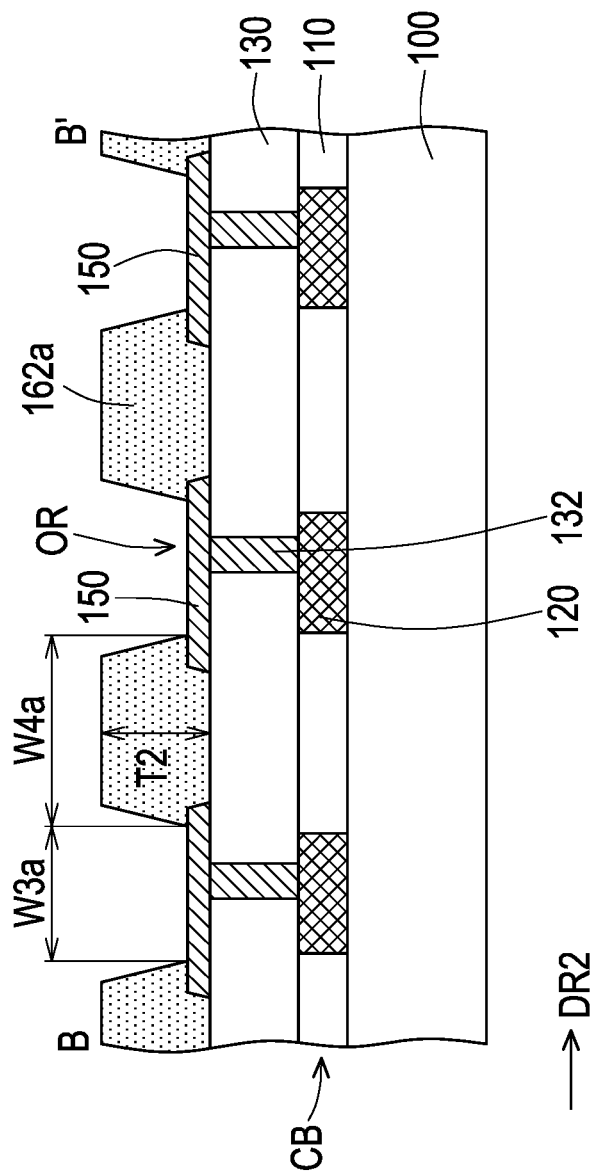
FIG. 2B is a schematic cross-sectional view along line B-B' of FIG. 1C.
Figure 2C:
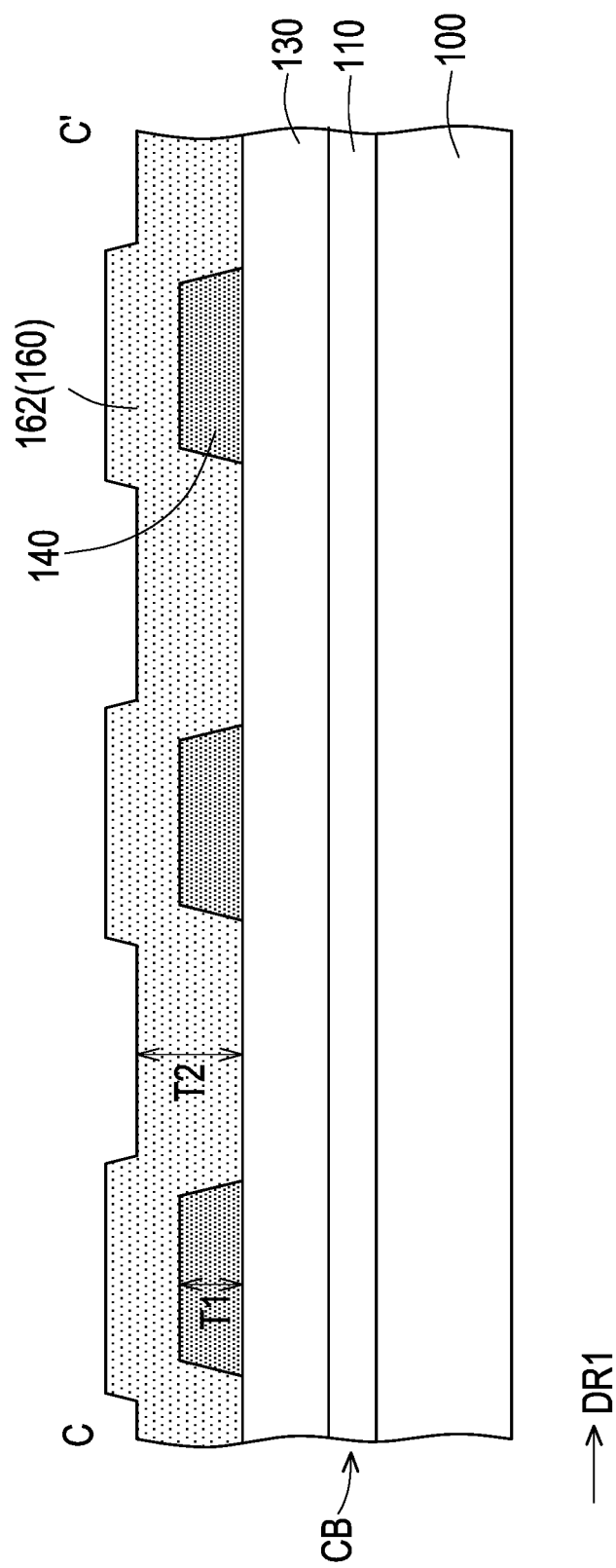
FIG. 2C is a schematic cross-sectional view along line C-C' of FIG. 1C.
Figure 2D:
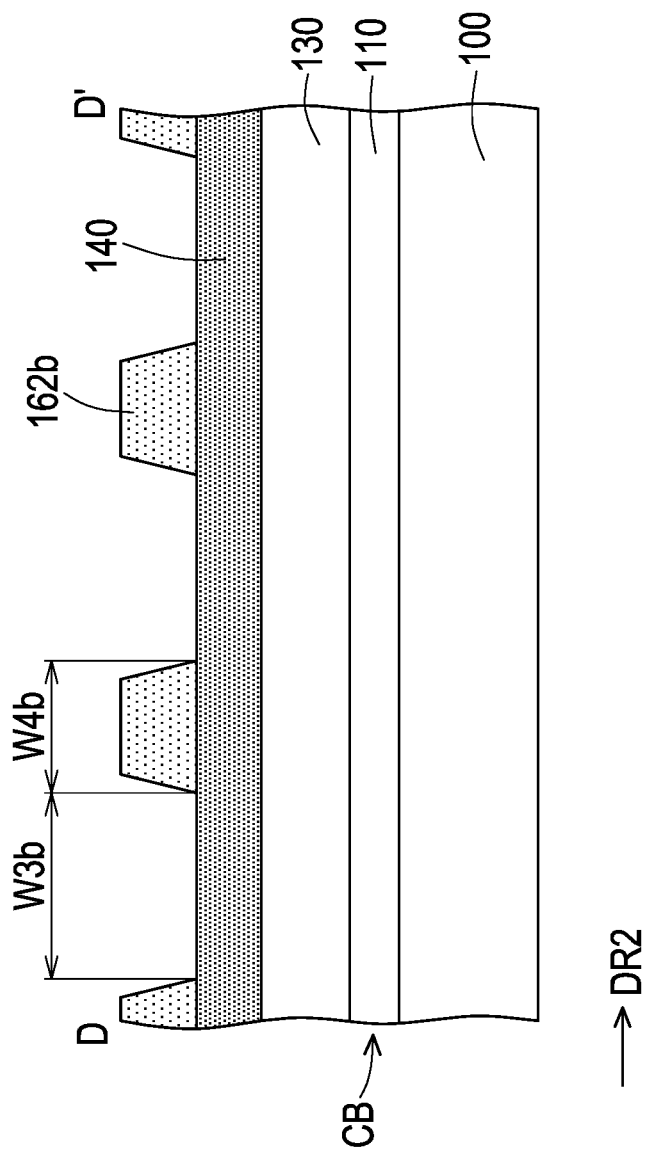
FIG. 2D is a schematic cross-sectional view along line D-D' of FIG. 1C.

Referring to FIG. 1A, FIG. 1B, and FIG. 1C, the second openings O2 are overlapped with the first openings O1, and the second openings O2 and the first openings O1 together form a plurality of organic light-emitting material filling regions OR. In other words, the first bank layer 140 and the second bank layer 160 define the plurality of organic light-emitting material filling regions OR. In the present embodiment, the thickness T1 of the first bank layer 140 is less than the thickness T2 of the second bank layer 160 (refer to FIG. 2A to FIG. 2D), and the periphery of each of the organic light-emitting material filling regions OR is substantially defined by the second bank layer 160, and each of the organic light-emitting material filling regions OR is extended along the first direction DR1 and spans the plurality of first strip structures 142.

In the present embodiment, since a single second opening O2 has the different widths W3a and W3b in the second direction DR2, each of the organic light-emitting material filling regions OR also has the different widths W3a and W3b in the second direction DR2. The maximum width W3b of a first portion ORb of each of the organic light-emitting material filling regions OR is greater than the maximum width W3a of a second portion ORa of each of the organic light-emitting material filling regions OR. In the present embodiment, the first portion ORb of the organic light-emitting material filling regions OR corresponds to the position of the narrow portion 162b of the second strip structures 162, and the second portion ORa of the organic light-emitting material filling regions OR corresponds to the positions of the thick portions 162a of the second strip structures 162. The first portion ORb is located between two corresponding second portions ORa. The second portion ORa of the organic light-emitting material filling regions OR spans a plurality of corresponding sub-pixels (shown in FIG. 7), and the length of the first portion ORb in the first direction DR1 is less than the length of the second portion ORa in the first direction DR1. In the present embodiment, the first portion ORb is located between two corresponding sub-pixels (shown in FIG. 7), but the invention is not limited thereto.

In the present embodiment, a portion of the first strip structures 142 is overlapped with the narrow portion 162b of the second strip structures 162. However, another portion of the first strip structures 142 is not overlapped with the narrow portion 162b of the second strip structures 162, but overlapped with the thick portions 162a of the second strip structures 162. In other words, the narrow portions 162b are not uniformly distributed in the entire display region AA.

Figure 3:
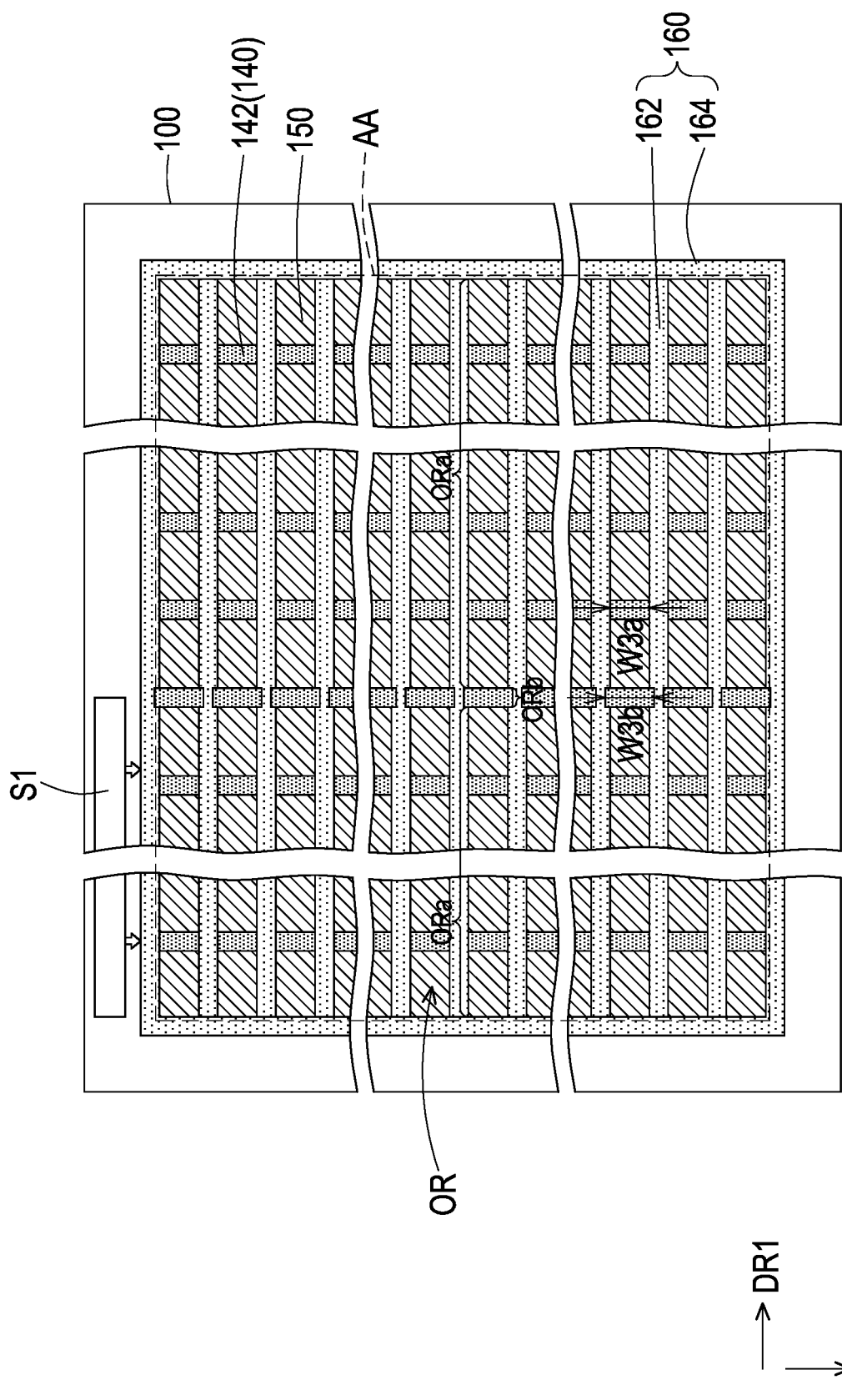
Figure 4:
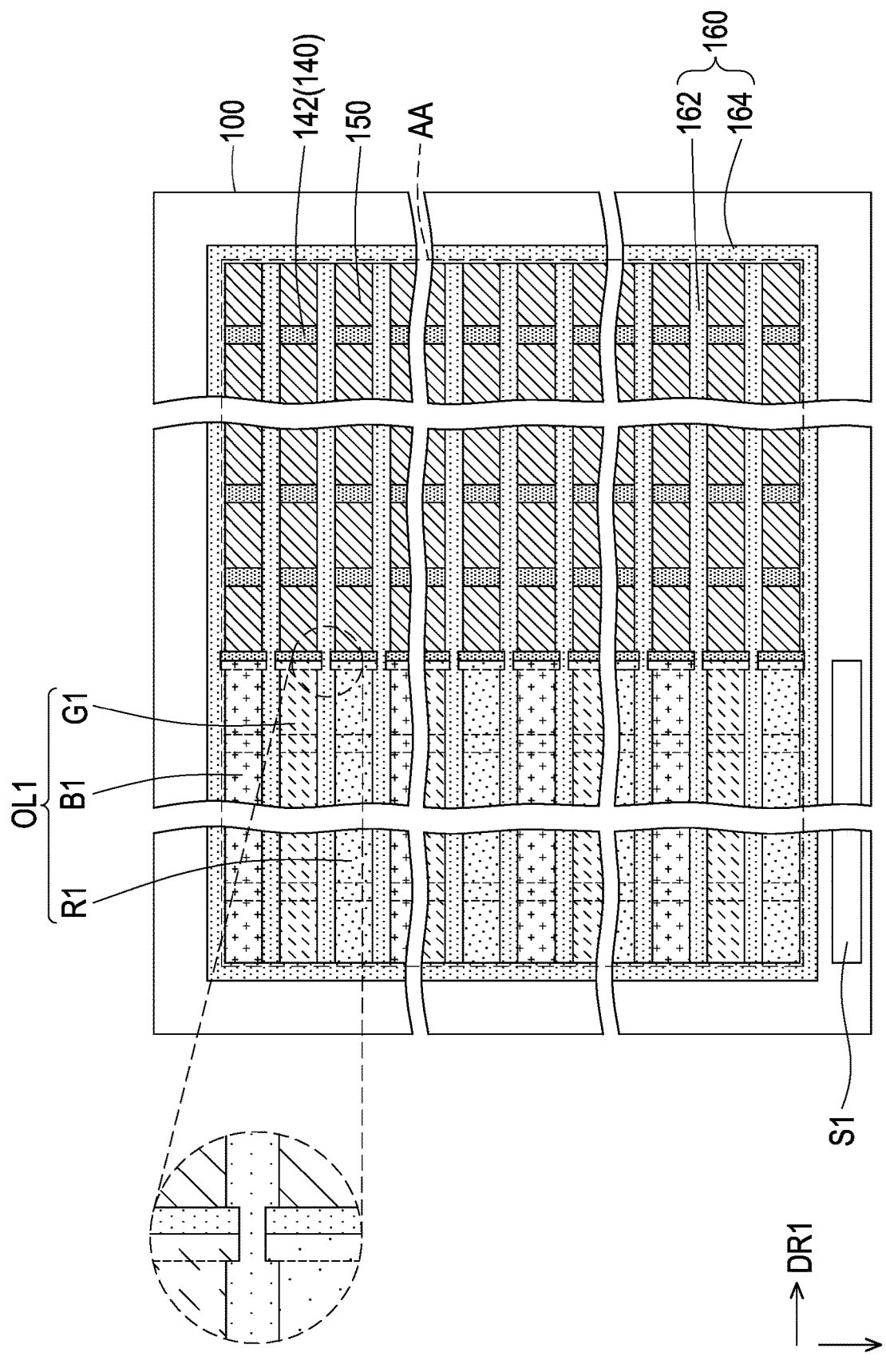

Referring to FIG. 3 and FIG. 4, a first spray head S1 is provided on the circuit substrate. The first spray head S1 has, for example, a plurality of nozzles (not shown in the figures), and the nozzles are suitable for spraying an organic light-emitting material. In some embodiments, the first spray head S1 is suitable for spraying one or more organic light-emitting materials. For example, the first spray head S1 may change the sprayed material as the position is changed.

The first spray head S1 is moved parallel to the second direction DR2, and fills a first organic light-emitting material layer OL1 in the organic light-emitting material filling regions OR. In the present embodiment, the first spray head S1 fills the first organic light-emitting material layer OL1 in one of the second portions ORa of the organic light-emitting material filling regions OR and a portion of the first portion ORb of the organic light-emitting material filling regions OR. The width of the first spray head S1 in the first direction DR1 is, for example, a width of tens to thousands of sub-pixels. In other words, in each of the organic light-emitting material filling regions OR, organic materials corresponding to tens to thousands of sub-pixels are all formed by the first spray head S1.

In the present embodiment, the first organic light-emitting material layer OL1 covers the upper surface of the plurality of first strip structures 142. In other words, the upper surface of a portion of the first strip structures 142 in the organic light-emitting material filling regions OR may be completely shielded by the first organic light-emitting material layer OL1. However, the invention is not limited thereto. In other embodiments, the upper surface of the first strip structures 142 may also not be shielded by the first organic light-emitting material layer OL1.

In the present embodiment, the first organic light-emitting material layer OL1 includes a first blue light-emitting material B1, a first green light-emitting material G1, and a first red light-emitting material R1. The first spray head S1 is moved parallel to the second direction DR2, and respectively fills the first blue light-emitting material B1, the first green light-emitting material G1, and the first red light-emitting material R1 in different organic light-emitting material filling regions OR. The arrangement of the first blue light-emitting material B1, the first green light-emitting material G1, and the first red light-emitting material R1 may be adjusted as needed. Moreover, in the present embodiment, the first organic light-emitting material layer OL1 also includes organic light-emitting materials of other colors, and the invention does not limit the number of colors of the first organic light-emitting material layer OL1. In some embodiments, the first bank layer 140 includes a hydrophilic material, and the second bank layer 160 includes a hydrophobic material, thus helping to prevent organic light-emitting materials of different colors from mixing with each other.

Figure 5:
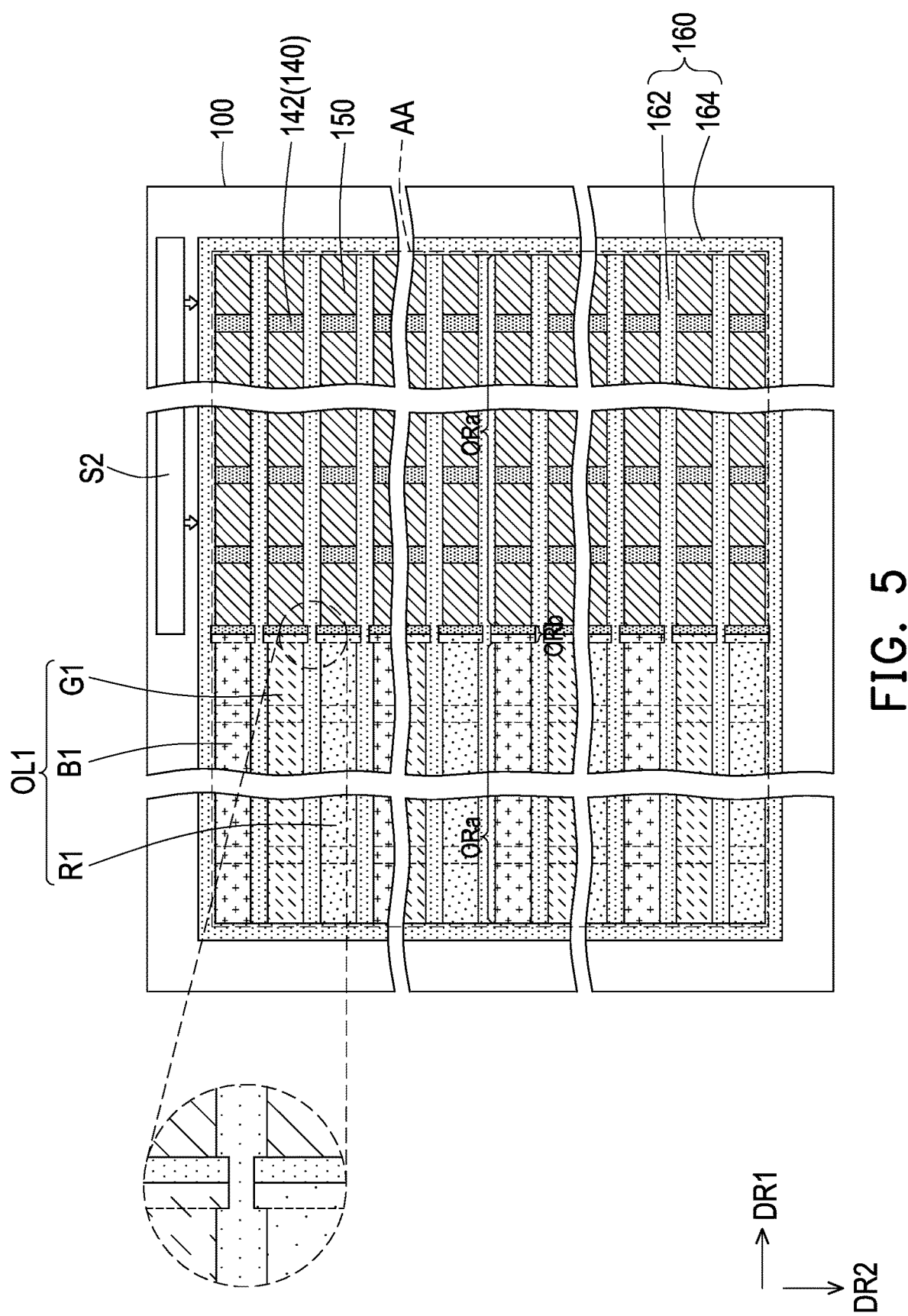
Figure 6:
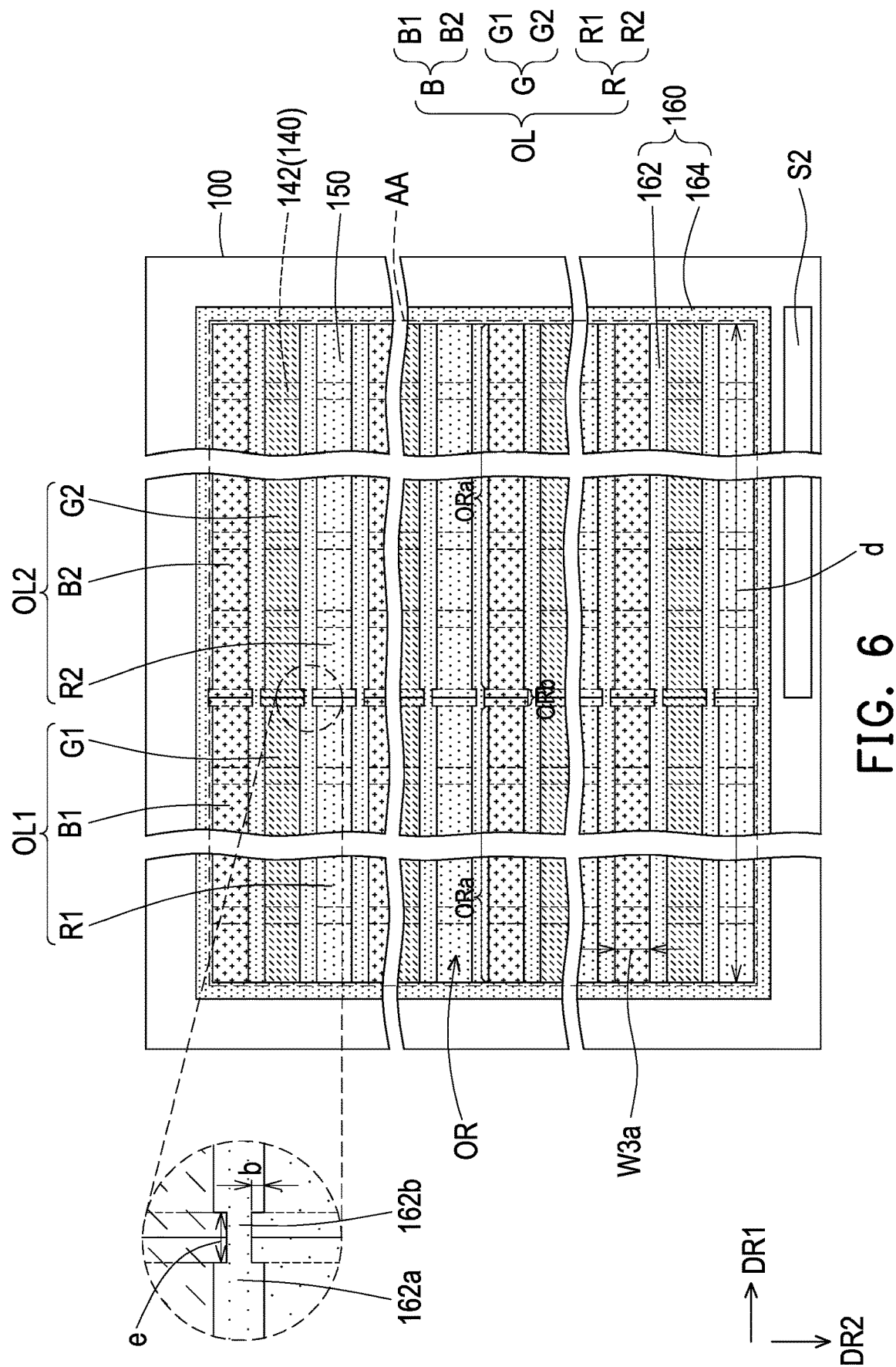
Figure 7:
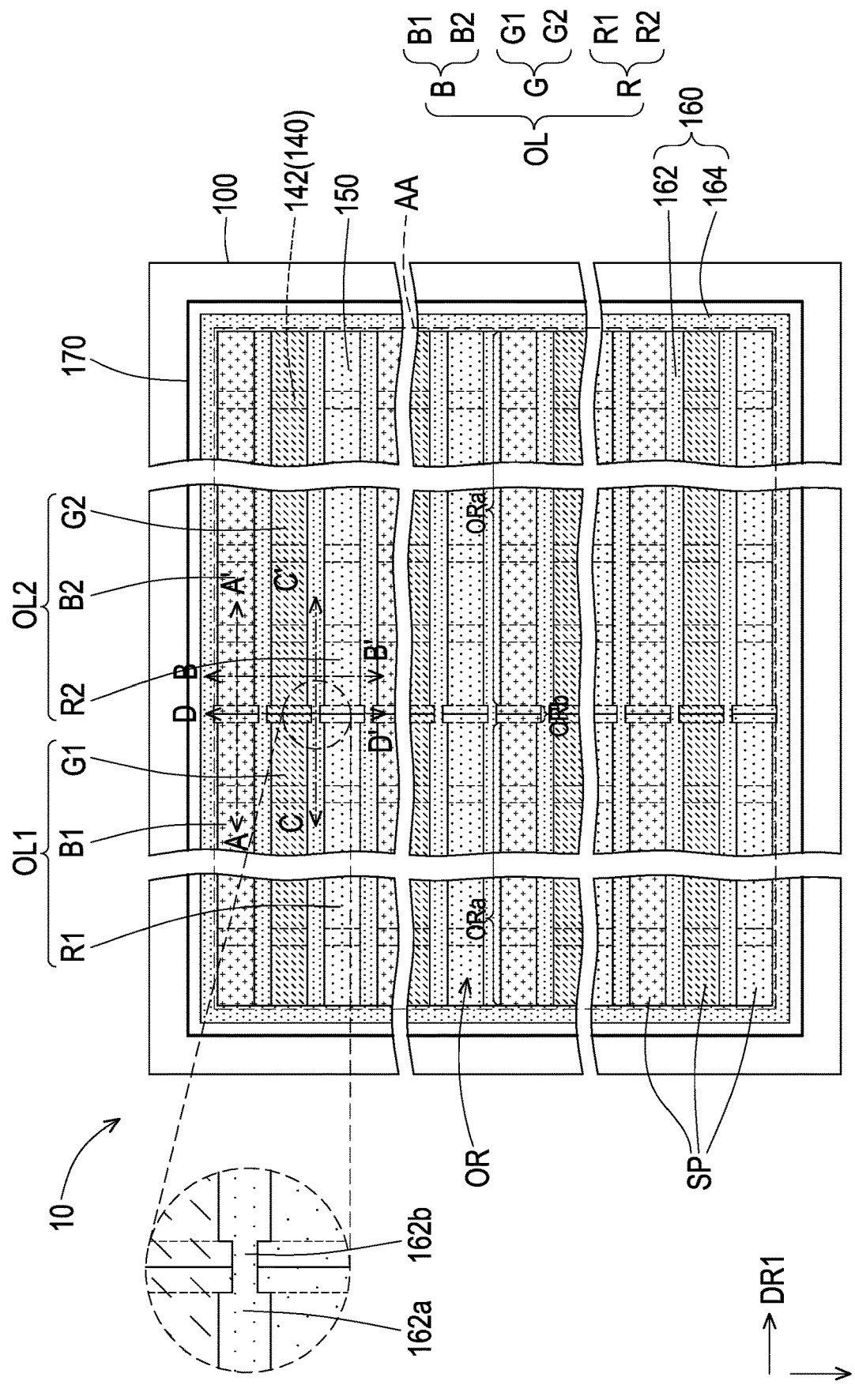
Figure 8A:
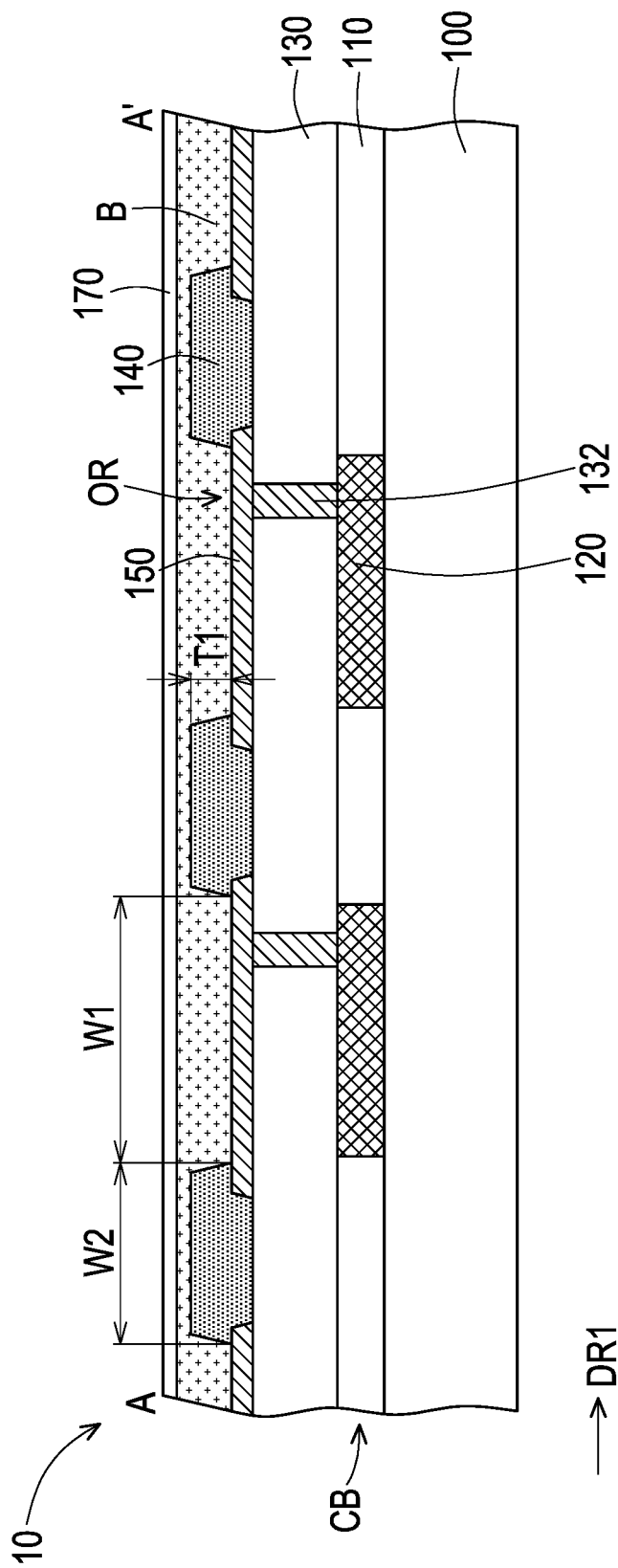
FIG. 8A is a schematic cross-sectional view along line A-A' of FIG. 7.
Figure 8B:
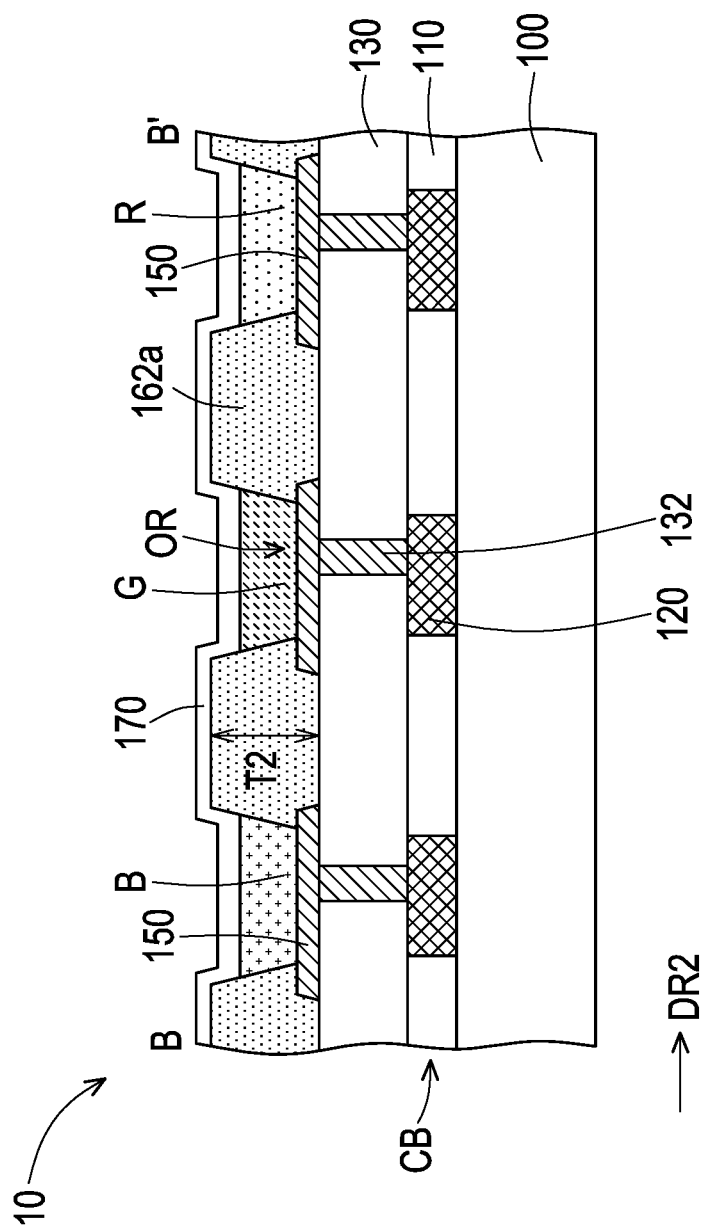
FIG. 8B is a schematic cross-sectional view along line B-B' of FIG. 7.
Figure 8C:
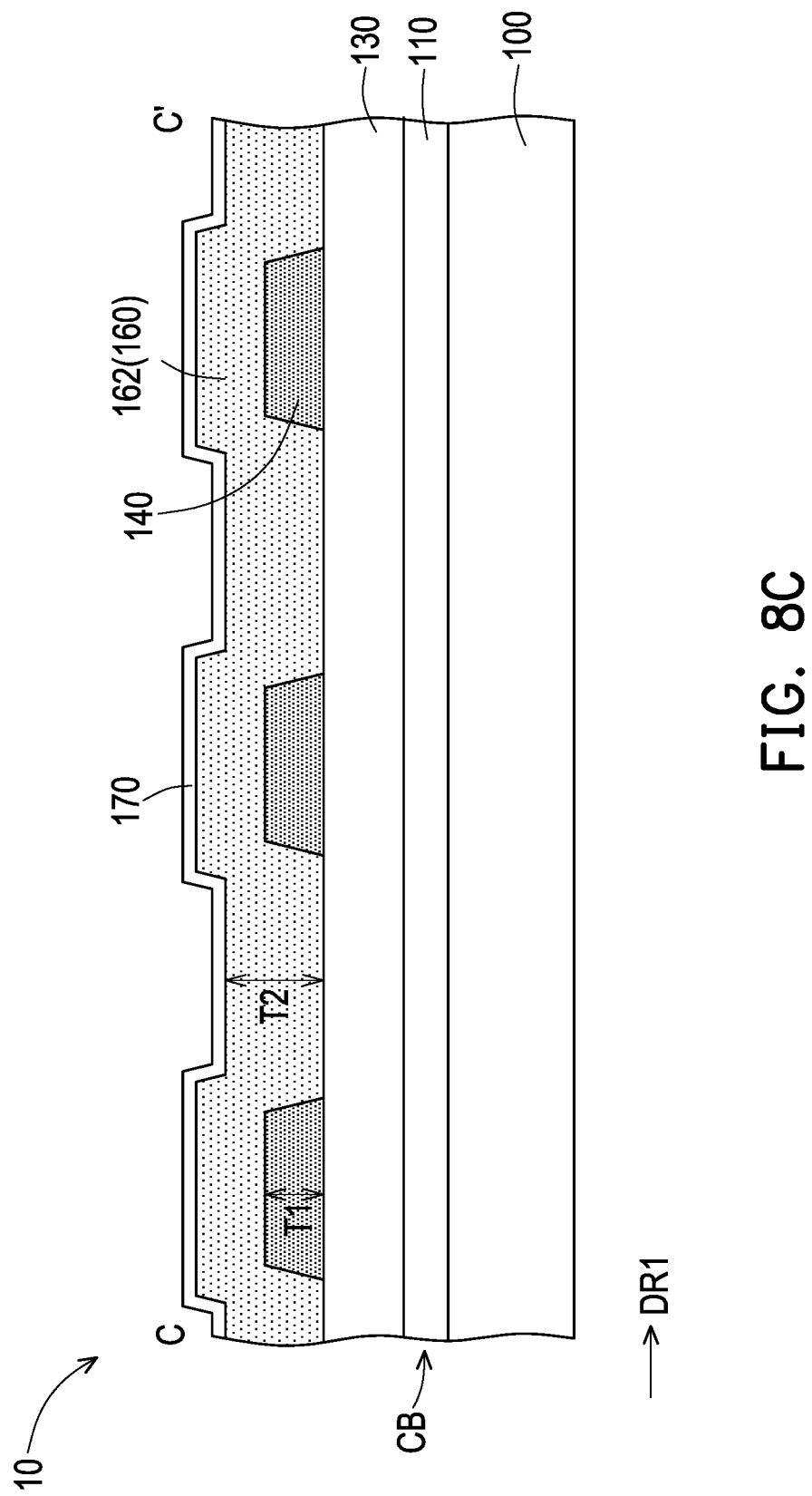
FIG. 8C is a schematic cross-sectional view along line C-C' of FIG. 7.
Figure 8D:
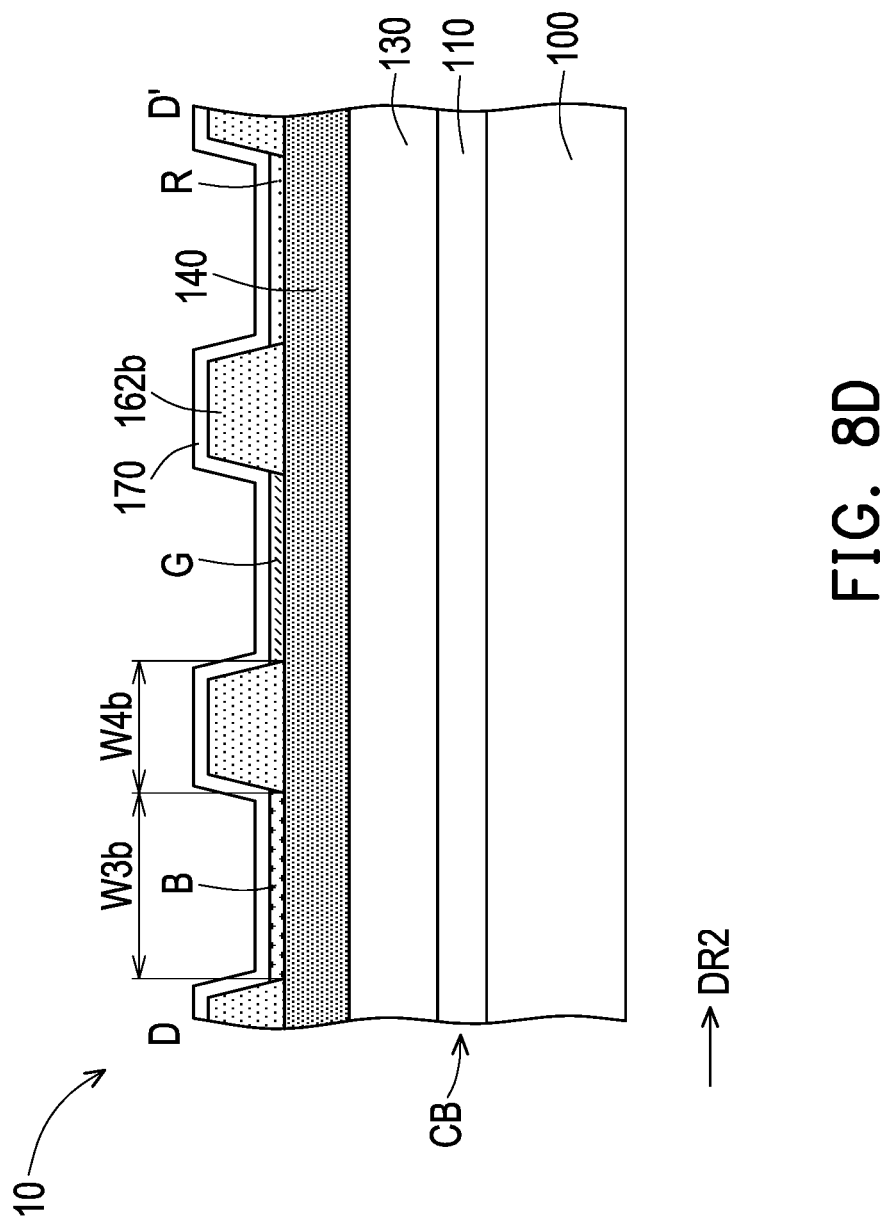
FIG. 8D is a schematic cross-sectional view along line D-D' of FIG. 7.

Referring to FIG. 5 and FIG. 6, a second spray head S2 is provided on the circuit substrate. The second spray head S2 has, for example, a plurality of nozzles (not shown in the figures), and the nozzles are suitable for spraying an organic light-emitting material. In some embodiments, the second spray head S2 is suitable for spraying one or more organic light-emitting materials. For example, the second spray head S2 may change the sprayed material as the position is changed.

The second spray head S2 is moved parallel to the second direction DR2, and fills a second organic light-emitting material layer OL2 in the organic light-emitting material filling regions OR. In the present embodiment, the second spray head S2 fills the second organic light-emitting material layer OL2 in another of the second portions ORa of the organic light-emitting material filling regions OR and another portion of the first portion ORb of the organic light-emitting material filling regions OR. The width of the second spray head S2 in the first direction DR1 is, for example, a width of tens to thousands of sub-pixels. In other words, in each of the organic light-emitting material filling regions OR, organic materials corresponding to tens to thousands of sub-pixels are all formed by the second spray head S2. The width of the second spray head S2 is the same as or different from the width of the first spray head S1. Although in the present embodiment, the first spray head S1 and the second spray head S2 are both moved along the same direction, the invention is not limited thereto. In other embodiments, the first spray head S1 and the second spray head S2 are moved along opposite directions.

In the present embodiment, the second organic light-emitting material layer OL2 covers the upper surface of the plurality of first strip structures 142. In other words, the upper surface of a portion of the first strip structures 142 in the organic light-emitting material filling regions OR may be completely shielded by the second organic light-emitting material layer OL2. However, the invention is not limited thereto. In other embodiments, the upper surface of the first strip structures 142 may also not be shielded by the second organic light-emitting material layer OL2.

In the present embodiment, the second organic light-emitting material layer OL2 includes a second blue light-emitting material B2, a second green light-emitting material G2, and a second red light-emitting material R2. Moreover, when the second spray head S2 is moved parallel to the second direction DR2, the second blue light-emitting material B2, the second green light-emitting material G2, and the second red light-emitting material R2 are respectively filled in different organic light-emitting material filling regions OR. The arrangement of the second blue light-emitting material B2, the second green light-emitting material G2, and the second red light-emitting material R2 may be adjusted as needed. Moreover, in the present embodiment, the second organic light-emitting material layer OL2 also includes light-emitting materials of other colors, and the invention does not limit the number of colors of the second organic light-emitting material layer OL2.

The side of the first organic light-emitting material layer OL1 is connected to the side of the second organic light-emitting material layer OL2. The side of the first blue light-emitting material B1 is connected to the side of the second blue light-emitting material B2, and a blue light-emitting layer B includes the first blue light-emitting material B1 and the second blue light-emitting material B2. The side of the first green light-emitting material G1 is connected to the side of the second green light-emitting material G2, and a green light-emitting layer G includes the first green light-emitting material G1 and the second green light-emitting material G2. The side of the first red light-emitting material R1 is connected to the side of the second red light-emitting material R2, and a red light-emitting layer R includes the first red light-emitting material R1 and the second red light-emitting material R2.

So far, an organic light-emitting material layer OL of the present embodiment is completed. The organic light-emitting material layer OL of the present embodiment includes the blue light-emitting layer B, the green light-emitting layer G, and the red light-emitting layer R. The organic light-emitting material layer OL is filled in the organic light-emitting material filling regions OR, and the blue light-emitting layer B, the green light-emitting layer G, and the red light-emitting layer R are respectively filled in different organic light-emitting material filling regions OR.

If the positions of the first spray head S1 and the second spray head S2 are deviated, the first organic light-emitting material layer OL1 may be overlapped with the second organic light-emitting material layer OL2. As a result, the film thickness variation c % of the finally formed organic light-emitting material layer OL is too large. Therefore, in some embodiments, at the junction of the first organic light-emitting material layer OL1 and the second organic light-emitting material layer OL2, the first portion ORb with a larger width in the second direction DR2 in the organic light-emitting material filling regions OR is pre-designed. Thereby, the organic light-emitting material filling regions OR may have a larger accommodating space at the junction of the first organic light-emitting material layer OL1 and the second organic light-emitting material layer OL2. In other words, by making the first portion ORb of the organic light-emitting material filling regions OR adjacent to or located at the junction of the first organic light-emitting material layer OL1 and the second organic light-emitting material layer OL2, it is possible to avoid the issue that the first organic light-emitting material layer OL1 is overlapped with the second organic light-emitting material layer OL2 in the normal direction of the base 100 and causing the film thickness variation c % of the organic light-emitting material layer OL to be too large. The first organic light-emitting material layer OL1 and the second organic light-emitting material layer OL2 use the same material as an example.

The reduced width b of a single side of the second strip structures 162 may be estimated by Formula 1.

$$b \approx c\% \times a \times d/2e \qquad \text{Formula 1:}$$

In Formula 1, the film thickness variation of the organic light-emitting material layer OL is c %, wherein c is not zero. e is the length of the narrow portion 162b of the second strip structures 162 in the first direction DR1. a is the width of a general sub-pixel, and may also be regarded as the width W3a of the second portion ORa of the organic light-emitting material filling regions OR. d is the spraying length of a single spray head (for example, the first spray head S1 or the second spray head S2) in the first direction DR1.

In the present embodiment, the organic light-emitting material layer OL is formed by spraying twice, but the invention is not limited thereto. In other embodiments, the organic light-emitting material layer OL may be formed via more spray coatings. The first portion ORb of the organic light-emitting material filling regions OR is disposed at all of the junctions of the organic light-emitting material formed by different spray coatings, thereby improving the production yield of the organic light-emitting material layer OL.

Next, referring to FIG. 7 and FIG. 8A to FIG. 8D, a second electrode 170 is formed on the first organic light-emitting material layer OL1 and the second organic light-emitting material layer OL2. The second electrode 170 is located on the organic light-emitting material layer OL. So far, the display panel 10 of the present embodiment is largely completed.

The first electrodes 150, the organic light-emitting material layer OL, and the second electrode 170 define a plurality of sub-pixels SP, and the second portion ORa (refer to FIG. 6) of each of the organic light-emitting material filling regions OR spans a plurality of corresponding sub-pixels SP. In the present embodiment, the first portion ORb (refer to FIG. 6) of each of the organic light-emitting material filling regions OR is located between two corresponding sub-pixels SP, but the invention is not limited thereto. In other embodiments, the first portion ORb may be disposed at other positions adjacent to the junction of the first organic light-emitting material layer OL1 and the second organic light-emitting material layer OL2.

Based on the above, an embodiment of the invention may reduce the negative impact on a display screen caused by the junction between the first organic light-emitting material layer OL1 and the second organic light-emitting material layer OL2.

Figure 9:
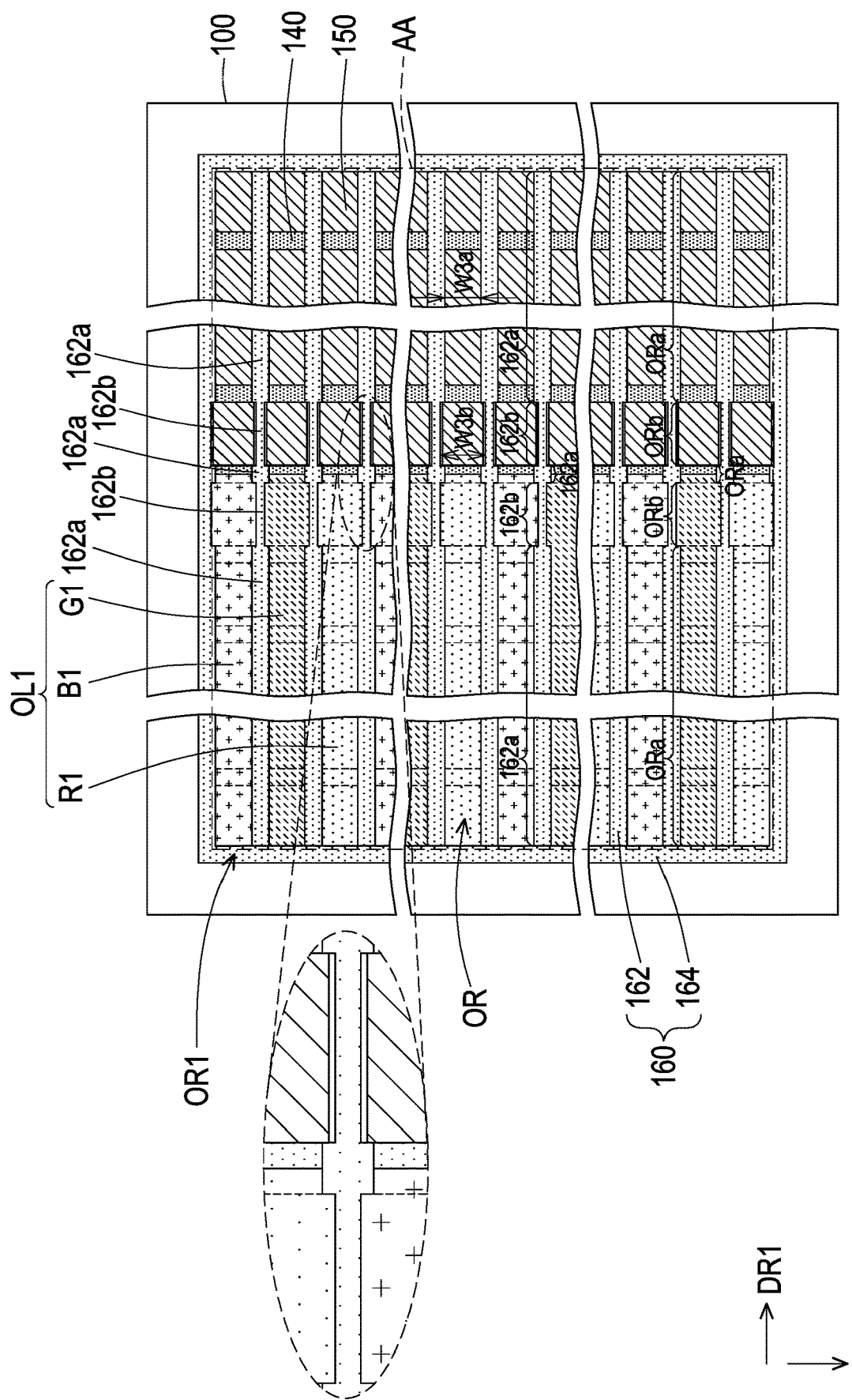
FIG. 9 and FIG. 10 are top views of a manufacturing method of a display panel according to an embodiment of the invention.
Figure 10:
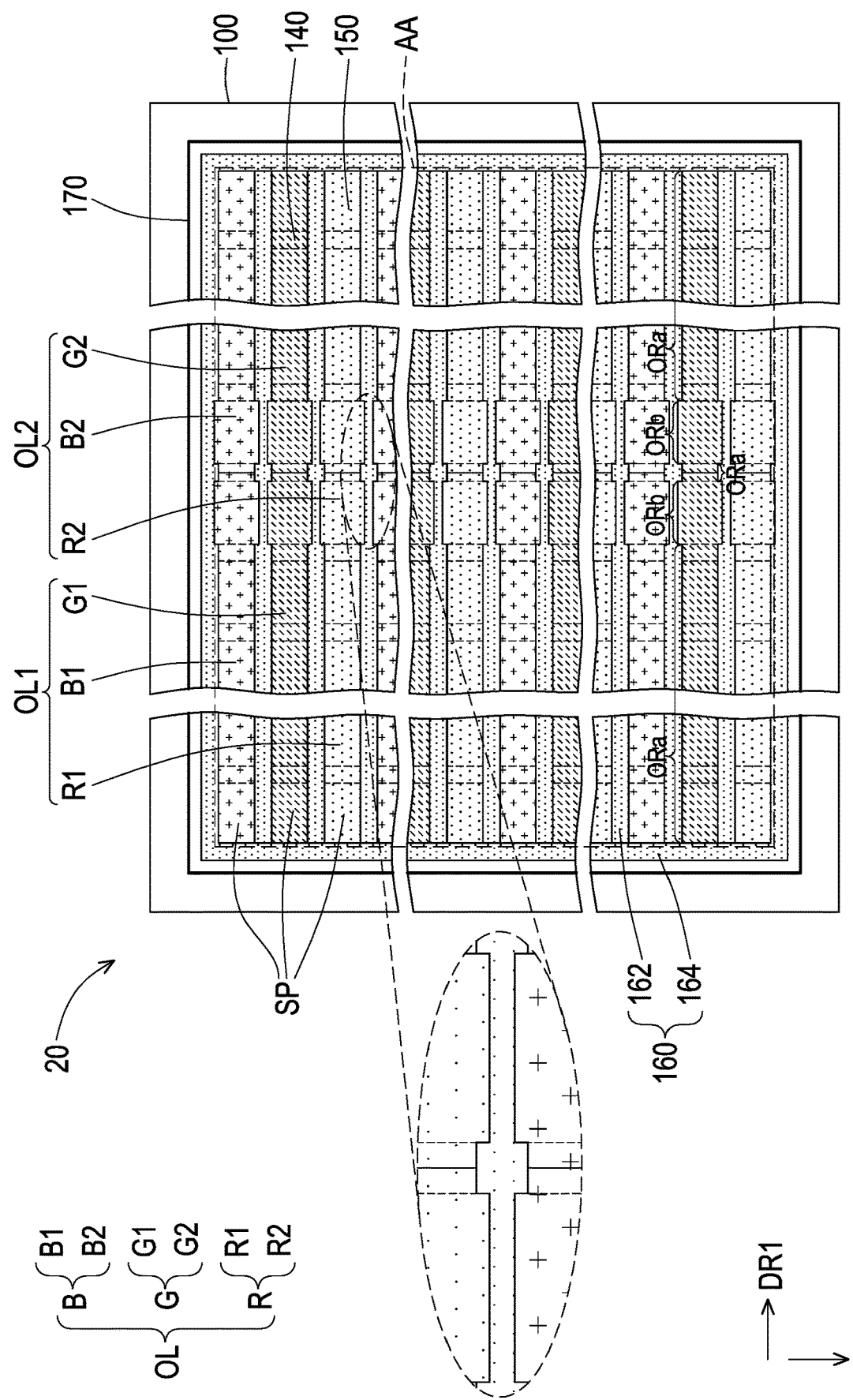

FIG. 9 and FIG. 10 are top views of a manufacturing method of a display panel according to an embodiment of the invention. It should be mentioned here that, the embodiment of FIG. 9 and FIG. 10 adopts the reference numerals of the embodiment of FIG. 1A to FIG. 8D and a portion of the contents thereof, wherein the same or similar numerals are used to represent the same or similar elements and descriptions of the same technical contents are omitted. The omitted portions are as described in the above embodiments and are not repeated herein.

Please refer to FIG. 9. In the present embodiment, each of the second strip structures 162 has a plurality of thick portions 162a and a plurality of narrow portions 162b. In some embodiments, two opposite sides of each of the second strip structures 162 are both provided with grooves corresponding to the narrow portions 162b, and the grooves are aligned with each other in the second direction DR2. Each of the organic light-emitting material filling regions OR includes a plurality of first portions ORb and a plurality of second portions ORa, and the maximum width W3b of the first portions ORb is greater than the maximum width W3a of the second portions ORa. Each of the first portions ORb is located between two corresponding second portions ORa.

The first organic light-emitting material layer OL1 is filled in the organic light-emitting material filling regions OR using a first spray head (not shown). In the present embodiment, the first spray head fills the first organic light-emitting material layer OL1 in one second portion ORa, at least one first portion ORb, and a portion of another second portion ORa of the organic light-emitting material filling regions OR.

Referring to FIG. 10, the second organic light-emitting material layer OL2 is filled in the organic light-emitting material filling regions OR using a second spray head (not shown). In the present embodiment, the second spray head fills the second organic light-emitting material layer OL2 in another portion of another second portion ORa, another first portion ORb, and yet another portion of the second portion ORa of the organic light-emitting material filling regions OR.

Next, the second electrode 170 is formed on the first organic light-emitting material layer OL1 and the second organic light-emitting material layer OL2. So far, a display panel 20 of the present embodiment is largely completed.

In the present embodiment, the first portion ORb of each of the organic light-emitting material filling regions OR is located in the middle of one corresponding sub-pixel SP, so that the sub-pixel SP has different widths. Specifically, the width of the sub-pixel SP (the sub-pixel SP located at the first portion ORb) close to the junction of the first organic light-emitting material layer OL1 and the second organic light-emitting material layer OL2 is greater than the width of the sub-pixel SP (the sub-pixel SP located at the second portion ORa) far from the junction of the first organic light-emitting material layer OL1 and the second organic light-emitting material layer OL2.

In the present embodiment, the first portions ORb of the organic light-emitting material filling regions OR are disposed at two sub-pixels SP close to the junction of the first organic light-emitting material layer OL1 and the second organic light-emitting material layer OL2, but the invention is not limited thereto. In other embodiments, the first portions ORb of the organic light-emitting material filling regions OR are disposed at two or more sub-pixels SP close to the junction of the first organic light-emitting material layer OL1 and the second organic light-emitting material layer OL2.

Based on the above, an embodiment of the invention may reduce the negative impact on a display screen caused by the junction between the first organic light-emitting material layer OL1 and the second organic light-emitting material layer OL2.

Figure 11:
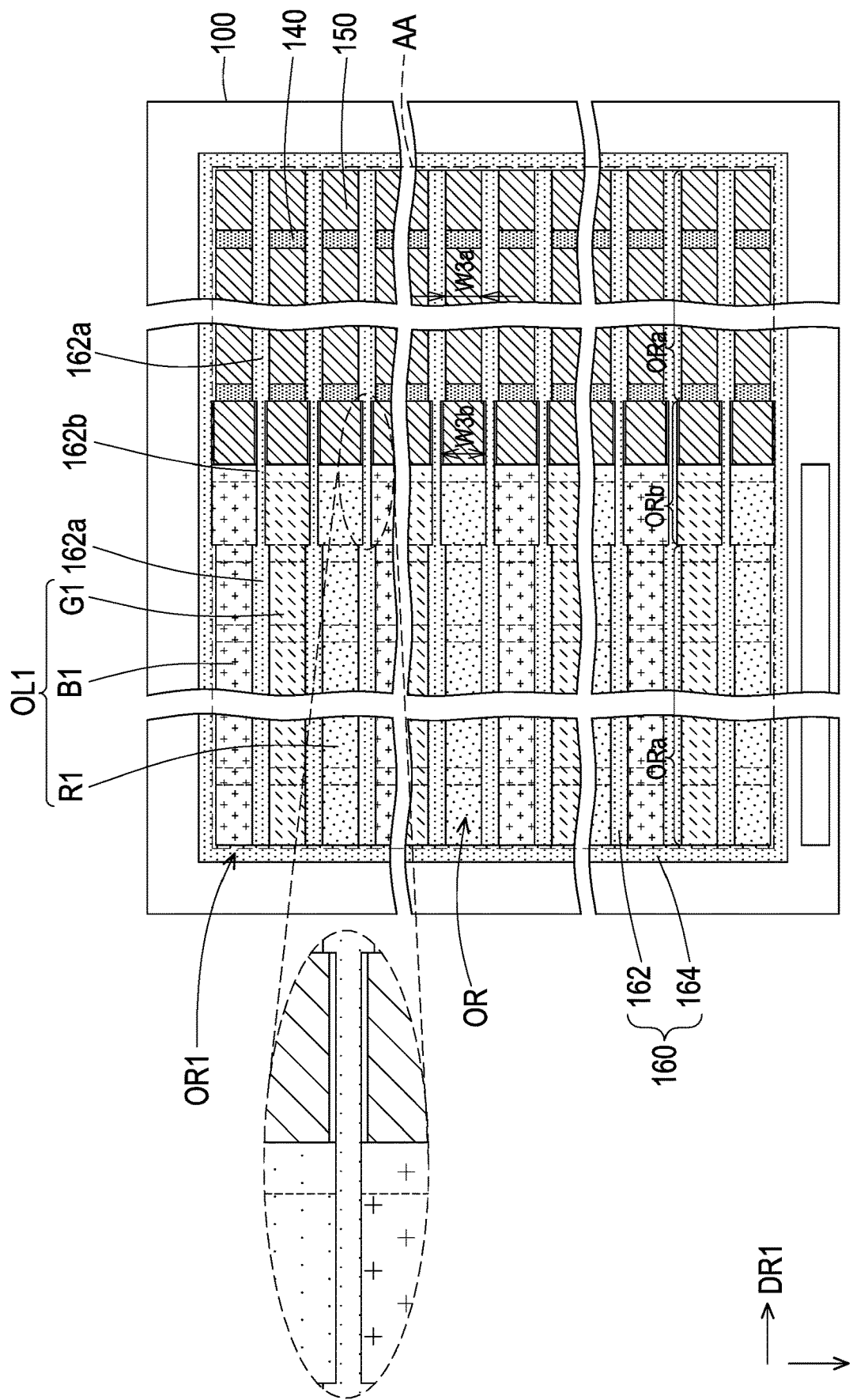
FIG. 11 and FIG. 12 are top views of a manufacturing method of a display panel according to an embodiment of the invention.
Figure 12:
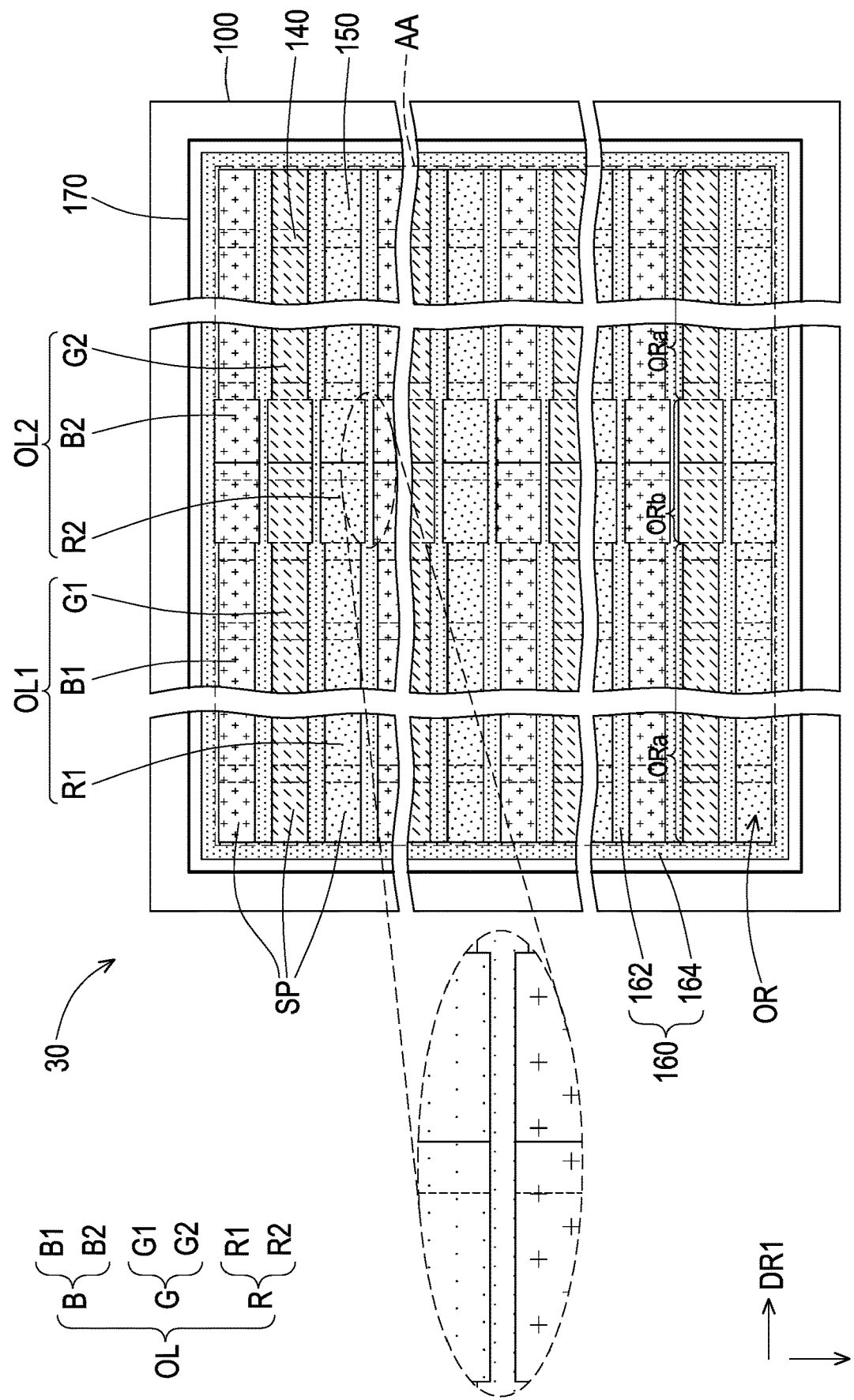

FIG. 11 and FIG. 12 are top views of a manufacturing method of a display panel according to an embodiment of the invention. It should be mentioned here that, the embodiment of FIG. 11 and FIG. 12 adopts the reference numerals of the embodiment of FIG. 1A to FIG. 8D and a portion of the contents thereof, wherein the same or similar numerals are used to represent the same or similar elements and descriptions of the same technical contents are omitted. The omitted portions are as described in the above embodiments and are not repeated herein.

Please refer to FIG. 11. In the present embodiment, each of the second strip structures 162 has the plurality of thick portions 162a and at least one narrow portion 162b. In some embodiments, two opposite sides of each of the second strip structures 162 are both provided with grooves corresponding to the narrow portion 162b, and the grooves are aligned with each other in the second direction DR2. Each of the organic light-emitting material filling regions OR includes a plurality of second portions ORa and at least one first portion ORb, and the maximum width W3b of the first portion ORb is greater than the maximum width W3a of the second portions ORa. Each of the first portions ORb is located between two corresponding second portions ORa.

The first organic light-emitting material layer OL1 is filled in the organic light-emitting material filling regions OR using a first spray head (not shown). In the present embodiment, the first spray head fills the first organic light-emitting material layer OL1 in one second portion ORa and a portion of the first portion ORb of the organic light-emitting material filling regions OR.

Referring to FIG. 12, the second organic light-emitting material layer OL2 is filled in the organic light-emitting material filling regions OR using a second spray head (not shown). In the present embodiment, the second spray head fills the second organic light-emitting material layer OL2 in another portion of the first portion ORb and another second portion ORa of the organic light-emitting material filling regions OR.

Next, the second electrode 170 is formed on the first organic light-emitting material layer OL1 and the second organic light-emitting material layer OL2. So far, a display panel 30 of the present embodiment is largely completed.

In the present embodiment, the first portion ORb of each of the organic light-emitting material filling regions OR spans a plurality of corresponding sub-pixels SP.

In the present embodiment, the first portion ORb of the organic light-emitting material filling regions OR is disposed at two sub-pixels SP close to the junction of the first organic light-emitting material layer OL1 and the second organic light-emitting material layer OL2, but the invention is not limited thereto. In other embodiments, the first portion ORb of the organic light-emitting material filling regions OR is disposed at two or more sub-pixels SP close to the junction of the first organic light-emitting material layer OL1 and the second organic light-emitting material layer OL2.

Based on the above, an embodiment of the invention may reduce the negative impact on a display screen caused by the junction between the first organic light-emitting material layer OL1 and the second organic light-emitting material layer OL2.

Figure 13A:
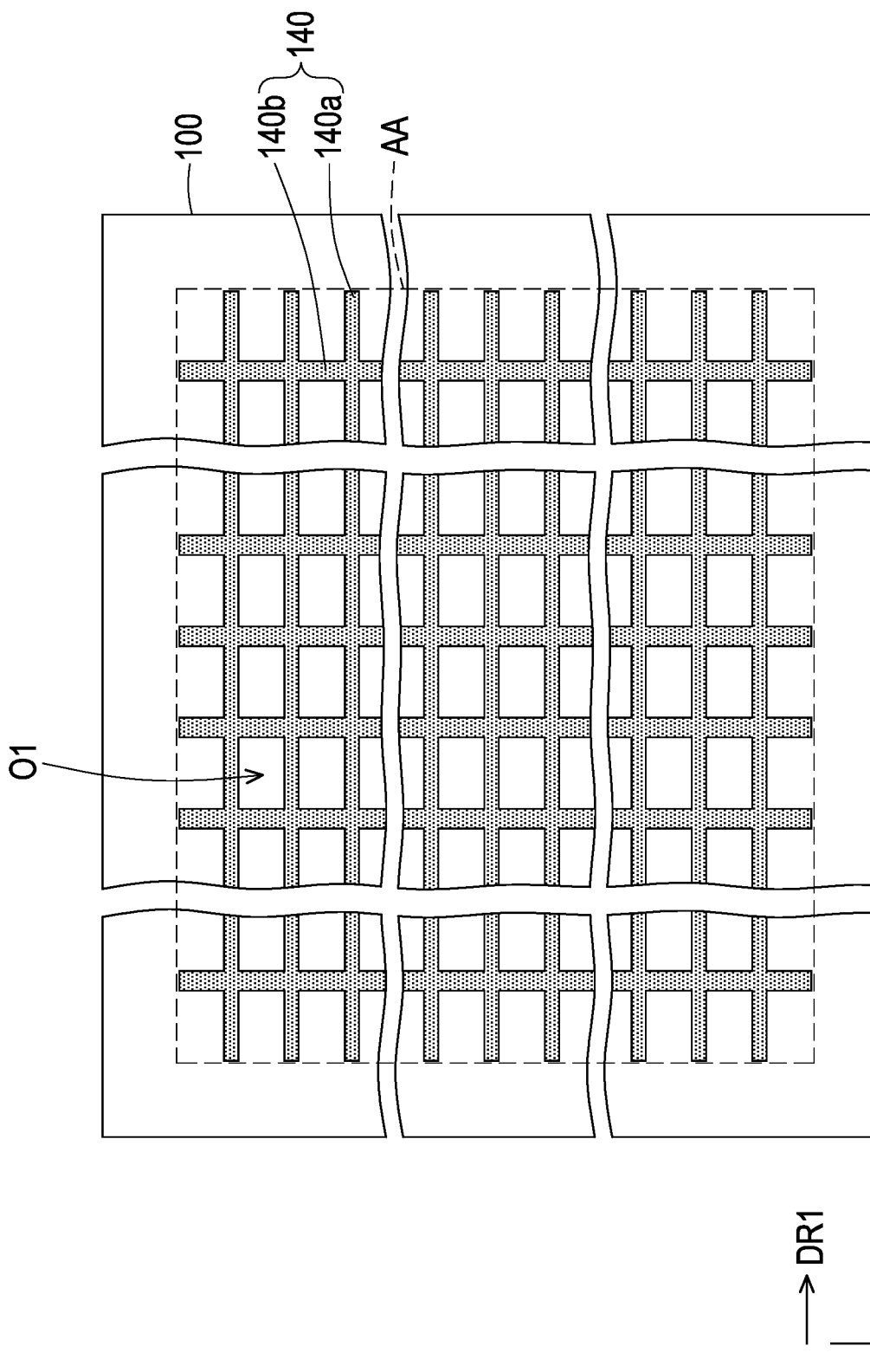
FIG. 13A is a schematic top view of a base and a first bank layer of a display panel according to an embodiment of the invention.
Figure 13B:
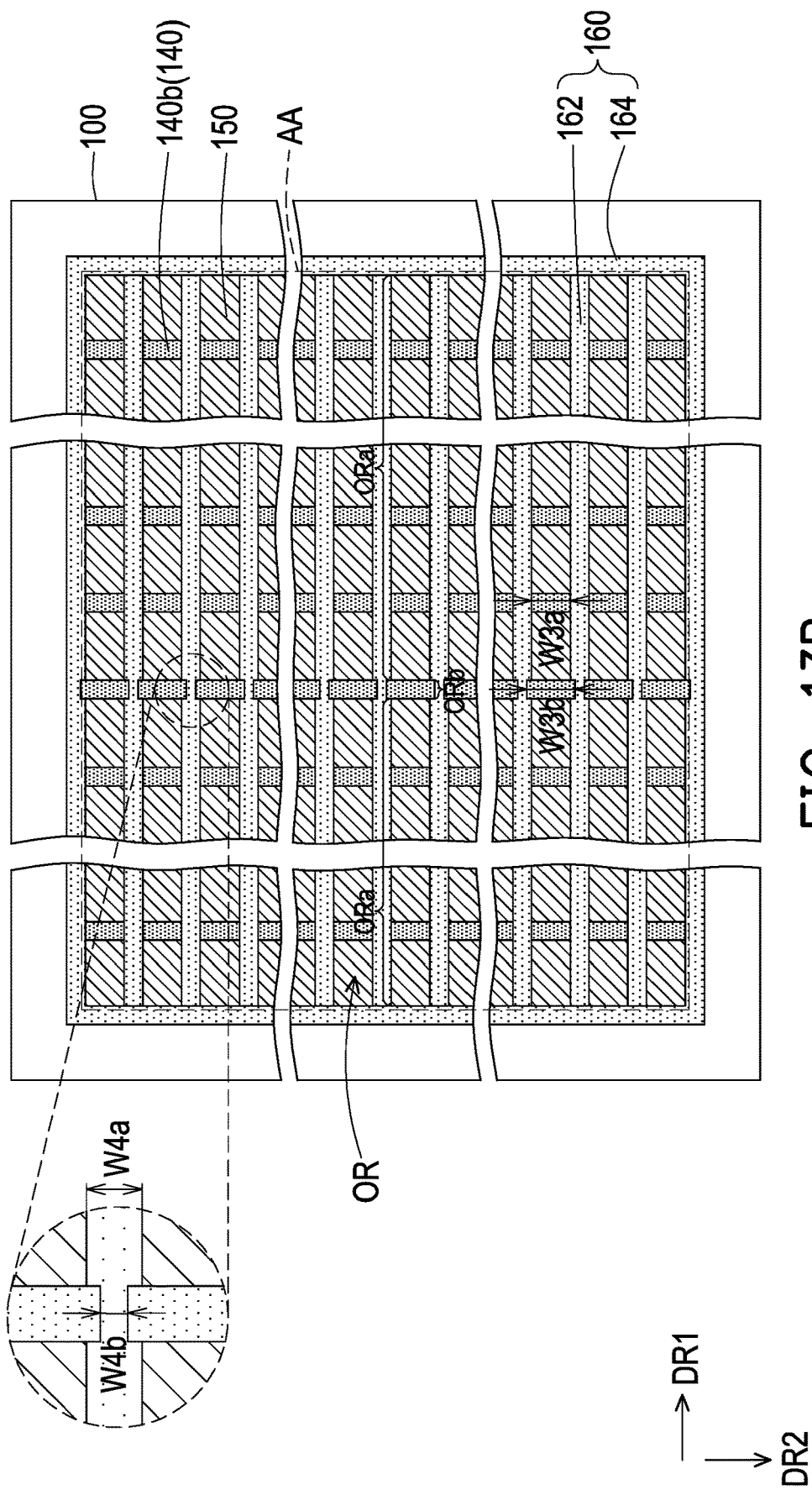
FIG. 13B is a schematic top view of a circuit substrate, a first bank layer, and a second bank of a display panel according to an embodiment of the invention.

FIG. 13A is a schematic top view of a base and a first bank layer of a display panel according to an embodiment of the invention. FIG. 13B is a schematic top view of a circuit substrate, a first bank layer, and a second bank of a display panel according to an embodiment of the invention. It should be mentioned here that, the embodiment of FIG. 13A and FIG. 13B adopts the reference numerals of the embodiment of FIG. 1A to FIG. 1C and a portion of the contents thereof, wherein the same or similar numerals are used to represent the same or similar elements and descriptions of the same technical contents are omitted. The omitted portions are as described in the above embodiments and are not repeated herein.

Please refer to FIG. 13A and FIG. 13B. In the present embodiment, the first bank layer 140 includes a mesh structure, and each of the first openings O1 is overlapped with one corresponding first electrode 150.

Specifically, the first bank layer 140 includes a first extension portion 140a extended along the first direction DR1 and a second extension portion 140b extended along the second direction DR2. The first extension portion 140a and the second extension portion 140b are connected to each other to form a mesh structure, and the first extension portion 140a and the second extension portion 140b define the plurality of first openings O1. In the present embodiment, the second bank layer 150 covers the first extension portion 140a of the first bank layer 140.

After the structure of FIG. 13B is provided, the organic light-emitting material layer may be formed in the same manner as that disclosed in FIG. 4 to FIG. 7.

Based on the above, the embodiments of the invention may reduce the negative impact of the organic light-emitting material layer on the display screen.

What is claimed is:

1. A display panel, comprising:
a circuit substrate;
a plurality of first electrodes located on the circuit substrate and located in a display region;
a first bank layer located on the first electrodes and having a plurality of first openings overlapped with the first electrodes;
a second bank layer located on the circuit substrate and on the first bank layer and having a plurality of second openings extended along a first direction, wherein a single second opening has a different width in a second direction, the second openings are overlapped with the first openings, the second openings and the first openings together form a plurality of organic light-emitting material filling regions, and a maximum width of a first portion of each of the organic light-emitting material filling regions is greater than a maximum width of a second portion of each of the organic light-emitting material filling regions;
an organic light-emitting material layer filled in the organic light-emitting material filling regions; and
a second electrode located on the organic light-emitting material layer, wherein the first electrodes, the organic light-emitting material layer, and the second electrode define a plurality of sub-pixels, and the second portion of each of the organic light-emitting material filling regions spans a plurality of corresponding sub-pixels.

2. The display panel of claim 1, wherein the first bank layer comprises a mesh structure, and each of the first openings is overlapped with one corresponding first electrode.

3. The display panel of claim 1, wherein the first bank layer comprises:
a plurality of first strip structures extended along the second direction, wherein the first direction is not parallel to the second direction, and each of the first openings is overlapped with a plurality of corresponding first electrodes.

4. The display panel of claim 1, wherein the second bank layer comprises:
a plurality of second strip structures extended along the first direction and located in the display region, wherein each of the second strip structures has a plurality of thick portions and at least one narrow portion located between the thick portions, and a width of the second openings at positions corresponding to the at least one narrow portion is greater than a width of the second openings at positions corresponding to the thick portions.

5. The display panel of claim 4, wherein two opposite sides of each of the second strip structures are provided with grooves corresponding to the narrow portions, and the grooves are aligned with each other in the second direction.

6. The display panel of claim 4, wherein the first bank layer comprises:
a plurality of first strip structures extended along the second direction, wherein the first direction is not parallel to the second direction, and a plurality of the first strip structures are not overlapped with the narrow portions of the second strip structures.

7. The display panel of claim 1, wherein the first portion of each of the organic light-emitting material filling regions is located between two corresponding sub-pixels.

8. The display panel of claim 1, wherein the first portion of each of the organic light-emitting material filling regions is located in a middle of one corresponding sub-pixel, so that the sub-pixels have different widths.

9. The display panel of claim 1, wherein the first portion of each of the organic light-emitting material filling regions spans a plurality of corresponding sub-pixels.

10. The display panel of claim 1, wherein a material of the first bank layer is different from a material of the second bank layer, and a thickness of the first bank layer is less than a thickness of the second bank layer.

11. The display panel of claim 1, wherein a width of the first portion of each of the organic light-emitting material filling regions is 10.5 µm to 90 µm, and a width of the second portion of each of the organic light-emitting material filling regions is 10 µm to 50 µm.

12. The display panel of claim 1, wherein the organic light-emitting material layer comprises a blue light-emitting layer, a green light-emitting layer, and a red light-emitting layer, and the blue light-emitting layer, the green light-emitting layer, and the red light-emitting layer are respectively filled in different organic light-emitting material filling regions.

13. A manufacturing method of a display panel, comprising:
providing a circuit substrate;
forming a plurality of first electrodes on the circuit substrate;
forming a first bank layer on the circuit substrate, wherein the first bank layer has a plurality of first openings overlapped with the first electrodes;
forming a second bank layer on the first bank layer and on the circuit substrate, wherein the second bank layer has a plurality of second openings extended along a first direction, a single second opening has a different width in a second direction, the second openings are overlapped with the first openings, the second openings and the first openings together form a plurality of organic light-emitting material filling regions, and a maximum width of a first portion of each of the organic light-emitting material filling regions is greater than a maximum width of a second portion of each of the organic light-emitting material filling regions;

a first spray head moving parallel to the second direction, and filling a first organic light-emitting material layer in the organic light-emitting material filling regions;

a second spray head moving parallel to the second direction and filling a second organic light-emitting material layer in the organic light-emitting material filling regions, wherein a side of the first organic light-emitting material layer is connected to a side of the second organic light-emitting material layer, and the first portion of the organic light-emitting material filling regions is adjacent to or located at a junction of the first organic light-emitting material layer and the second organic light-emitting material layer; and forming a second electrode on the first organic light-emitting material layer and the second organic light-emitting material layer.

14. The manufacturing method of the display panel of claim 13, wherein the first electrodes, the first organic light-emitting material layer, the second organic light-emitting material layer, and the second electrode define a plurality of sub-pixels, and the second portion of each of the organic light-emitting material filling regions spans a plurality of corresponding sub-pixels.

15. The manufacturing method of the display panel of claim 13, wherein the first organic light-emitting material layer comprises a first blue light-emitting material, a first green light-emitting material, and a first red light-emitting material, and when the first spray head is moved parallel to the second direction, the first blue light-emitting material, the first green light-emitting material, and the first red light-emitting material are respectively filled in different organic light-emitting material filling regions.

* * * * *